(12) United States Patent
Scarbrough et al.

(10) Patent No.: US 12,040,253 B2
(45) Date of Patent: Jul. 16, 2024

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Alyssa N. Scarbrough, Boise, ID (US); John D. Hopkins, Meridian, ID (US); Chet E. Carter, Boise, ID (US); Justin D. Shepherdson, Meridian, ID (US); Collin Howder, Boise, ID (US); Joshua Wolanyk, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 415 days.

(21) Appl. No.: 17/508,143

(22) Filed: Oct. 22, 2021

(65) Prior Publication Data
US 2023/0062403 A1 Mar. 2, 2023

Related U.S. Application Data

(60) Provisional application No. 63/239,543, filed on Sep. 1, 2021.

(51) Int. Cl.
*H01L 23/48* (2006.01)
*H10B 41/10* (2023.01)
(Continued)

(52) U.S. Cl.
CPC .......... *H01L 23/481* (2013.01); *H10B 41/10* (2023.02); *H10B 41/27* (2023.02); *H10B 41/35* (2023.02);
(Continued)

(58) Field of Classification Search
CPC ....... H01L 23/481; H10B 41/10; H10B 41/27; H10B 41/35; H10B 43/10; H10B 43/27; H10B 43/35; H10B 43/50
(Continued)

(56) References Cited

U.S. PATENT DOCUMENTS 10,014,309 B2 * 7/2018 Dorhout ................ H10B 43/27
2018/0006052 A1 1/2018 Hwang
(Continued)

FOREIGN PATENT DOCUMENTS

TW 202036856 10/2020

OTHER PUBLICATIONS

U.S. Appl. No. 17/398,188, filed Aug. 10, 2021, by Scarbrough et al.
(Continued)

*Primary Examiner* — Tan N Tran
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers above a conductor tier. Strings of memory cells comprise channel-material strings that extend through the insulative tiers and the conductive tiers. The channel-material strings directly electrically couple with conductor material of the conductor tier by conducting material that is in a lowest of the conductive tiers and that is directly against multiple of the channel-material strings. A through-array-via (TAV) region comprises TAVs that individually extend through the lowest conductive tier and into the conductor tier. Individual of the TAVs in the lowest conductive tier comprise a conductive core having an annulus circumferentially there-about. The annulus has dopant therein at a total dopant concentration of 0.01 to 30 atomic
(Continued)

percent. Insulative material in the lowest conductive tier is circumferentially about the annulus and between immediately-adjacent of the TAVs. Other embodiments, including method, are disclosed.

61 Claims, 21 Drawing Sheets

(51) Int. Cl.
  *H10B 41/27* (2023.01)
  *H10B 41/35* (2023.01)
  *H10B 43/10* (2023.01)
  *H10B 43/27* (2023.01)
  *H10B 43/35* (2023.01)
(52) U.S. Cl.
  CPC ............ *H10B 43/10* (2023.02); *H10B 43/27* (2023.02); *H10B 43/35* (2023.02)
(58) Field of Classification Search
  USPC ........................................................ 257/314
  See application file for complete search history.

(56) References Cited

U.S. PATENT DOCUMENTS

| | | |
|---|---|---|
| 2020/0051997 A1 | 2/2020 | Park |
| 2020/0135749 A1 | 4/2020 | Hwang et al. |
| 2020/0168622 A1 | 5/2020 | Fukuzumi et al. |
| 2020/0295033 A1 | 9/2020 | Sakamoto et al. |
| 2020/0402905 A1 | 12/2020 | Otsu et al. |
| 2021/0057441 A1 | 2/2021 | Xu et al. |
| 2021/0151460 A1 | 5/2021 | Kim et al. |
| 2021/0217761 A1 | 7/2021 | Tiwari |

OTHER PUBLICATIONS

U.S. Appl. No. 17/399,283, filed Aug. 11, 2021, by Barclay et al.
U.S. Appl. No. 17/409,300, filed Aug. 23, 2021, by Scarbrough et al.
U.S. Appl. No. 17/409,355, filed Aug. 23, 2021, by Scarbrough et al.
U.S. Appl. No. 17/231,895, filed Apr. 15, 2021, by Chandolu et al.

* cited by examiner

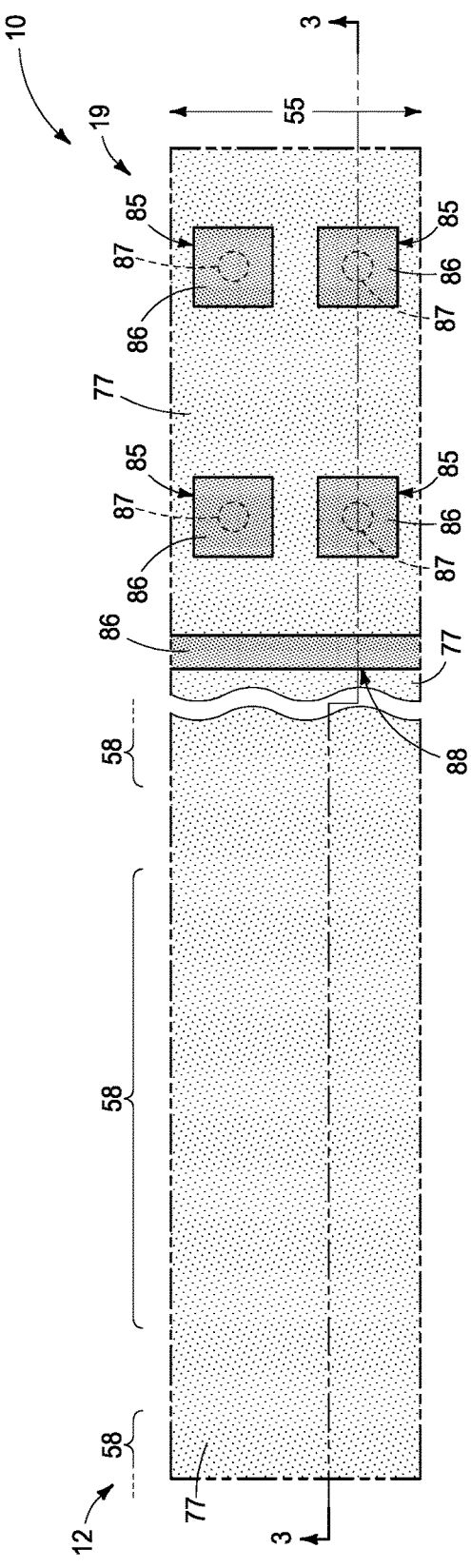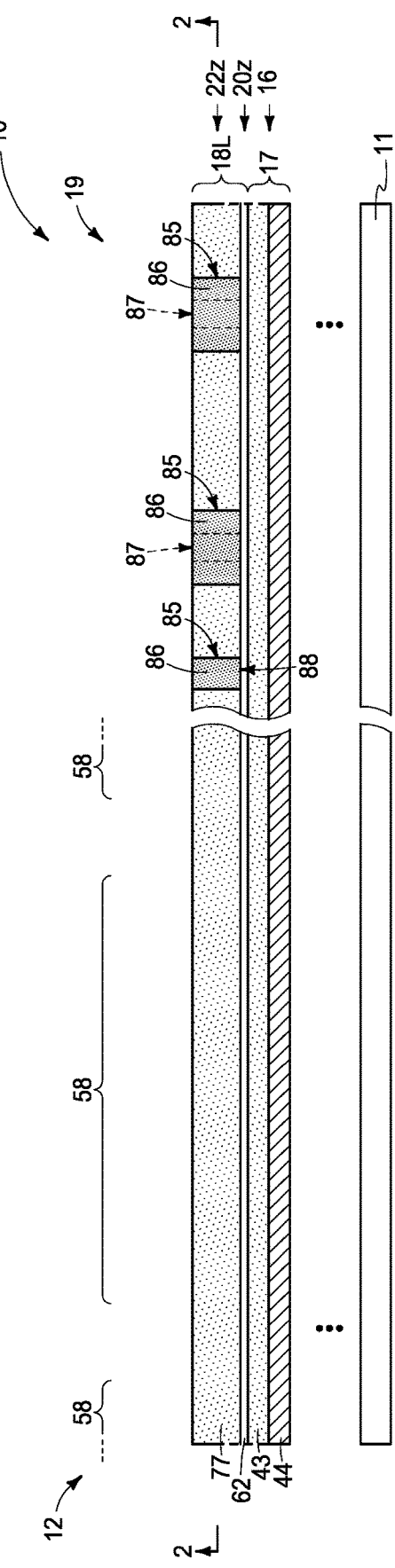

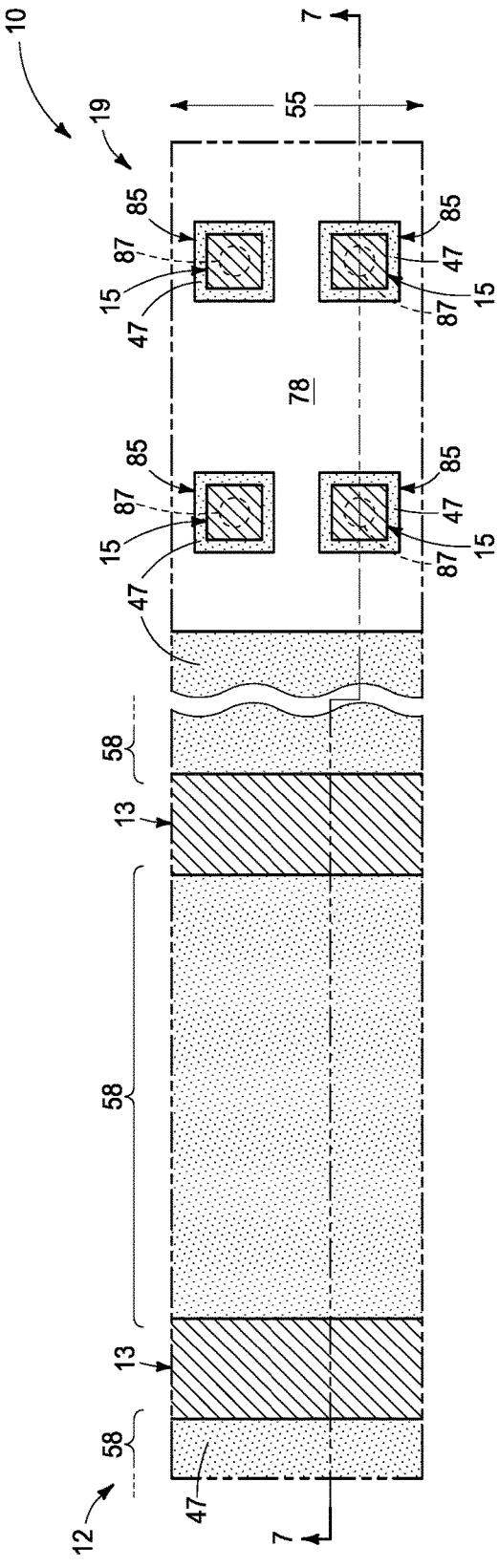
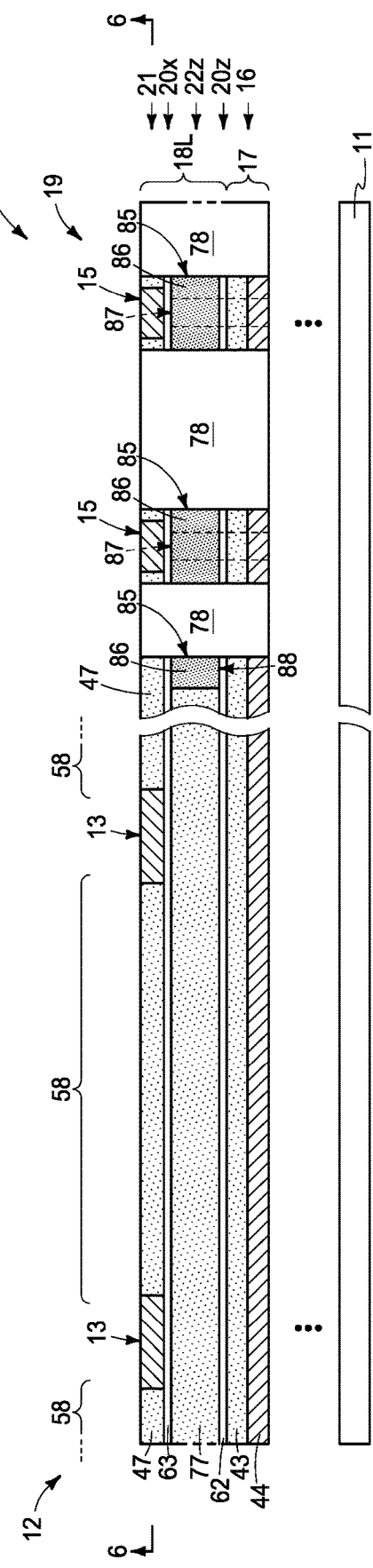
FIG. 6
FIG. 7

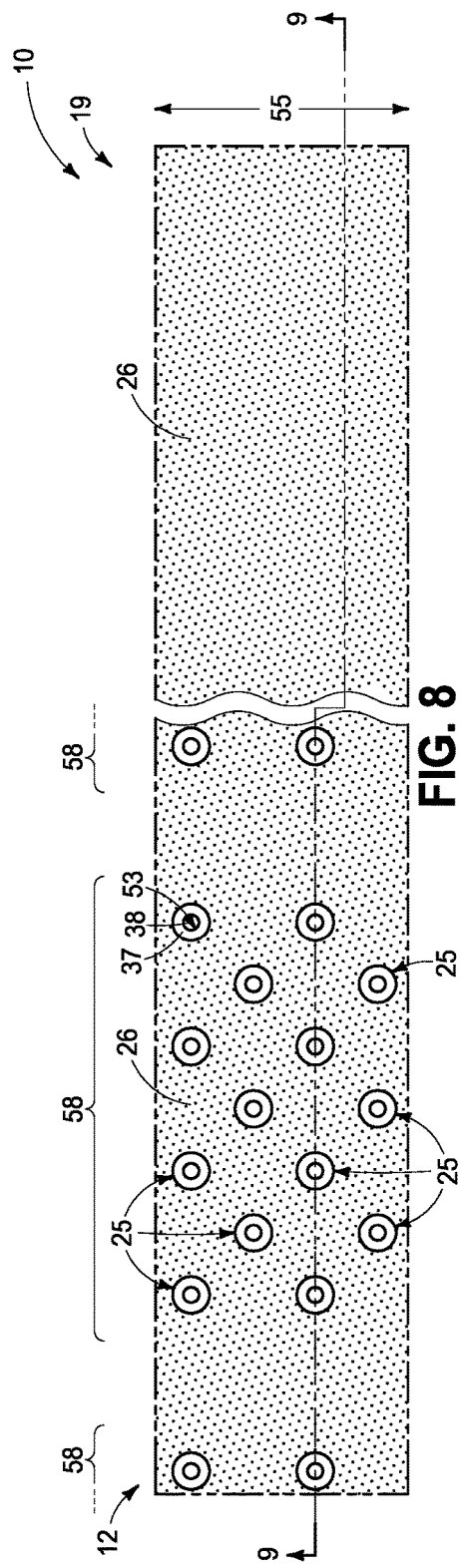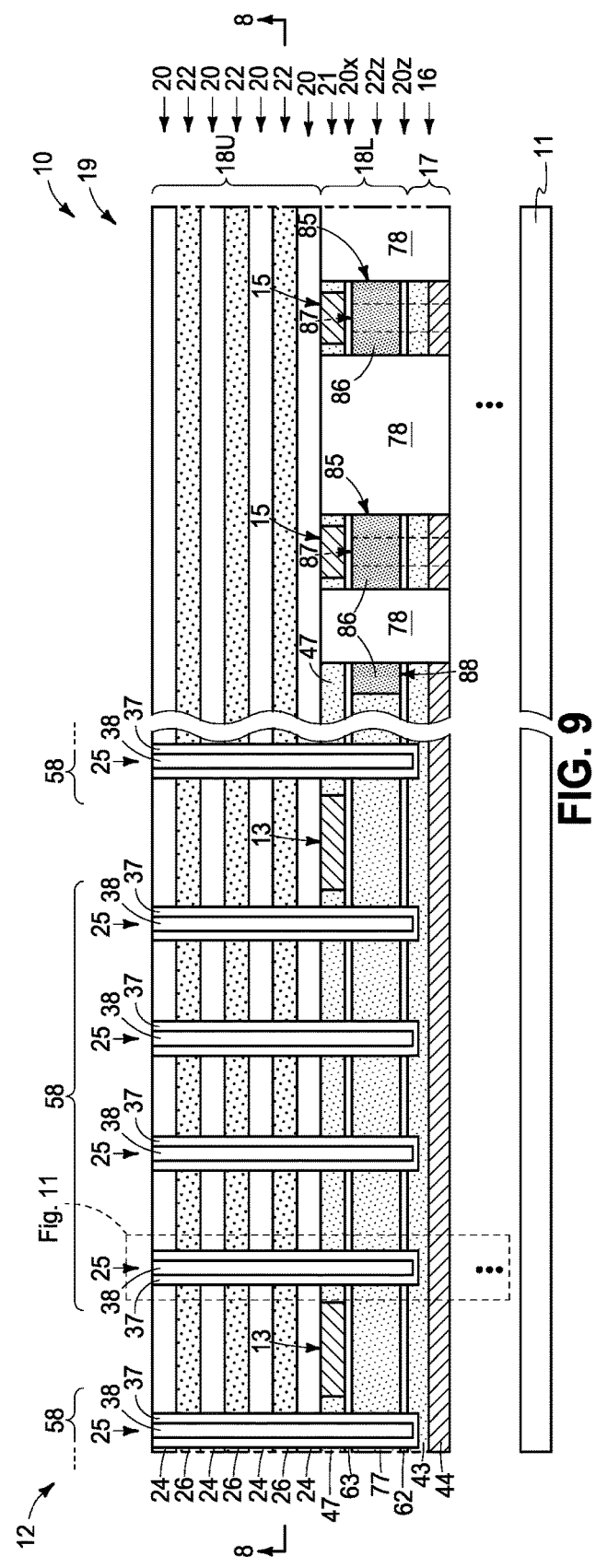

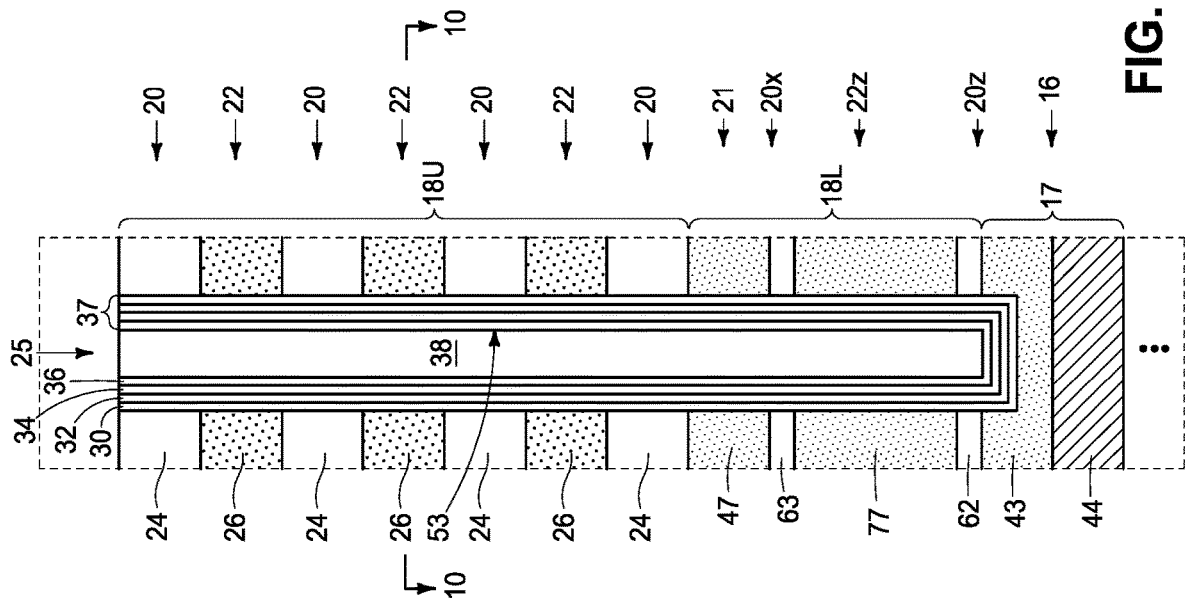

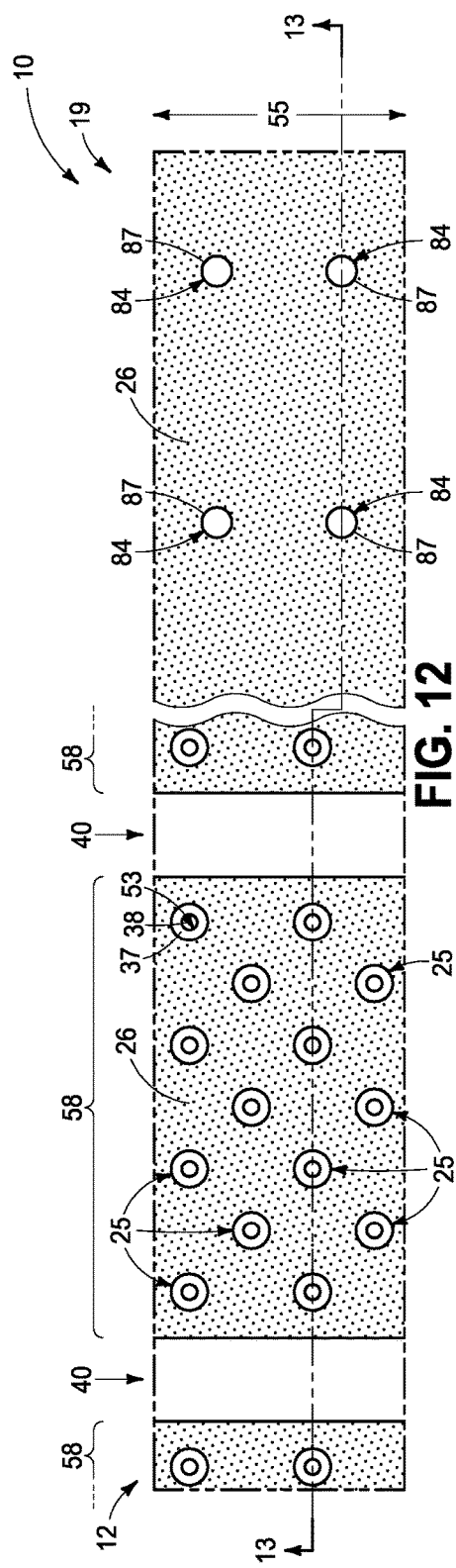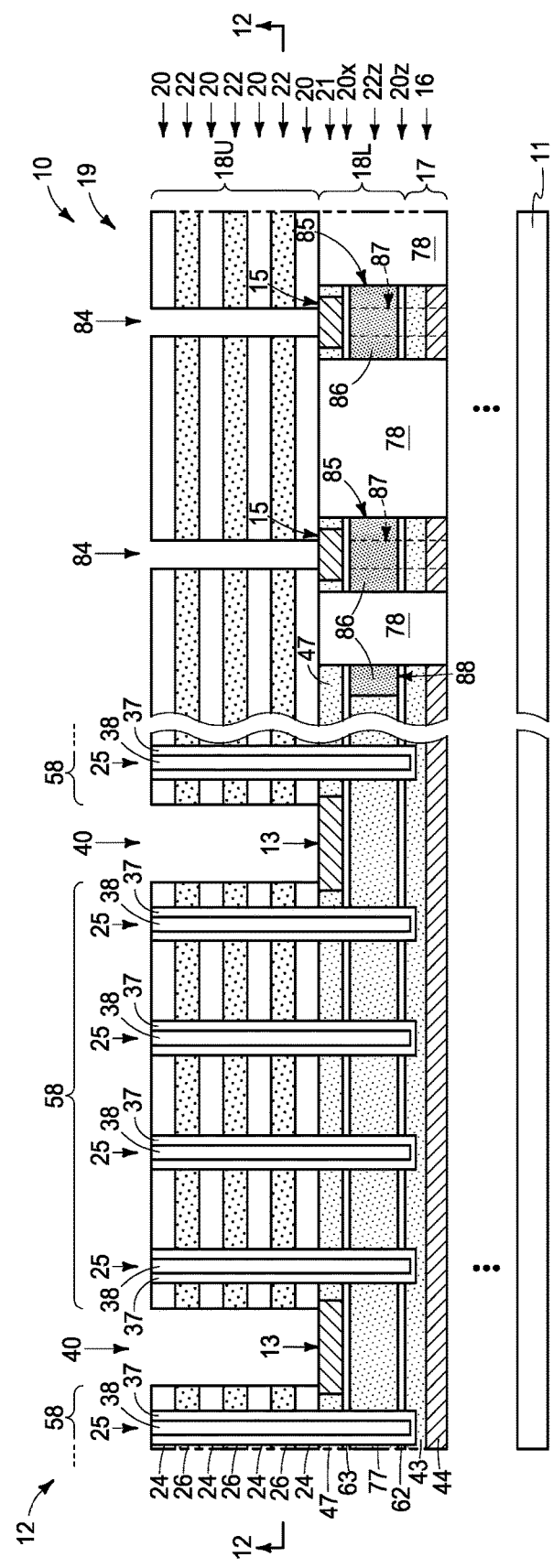

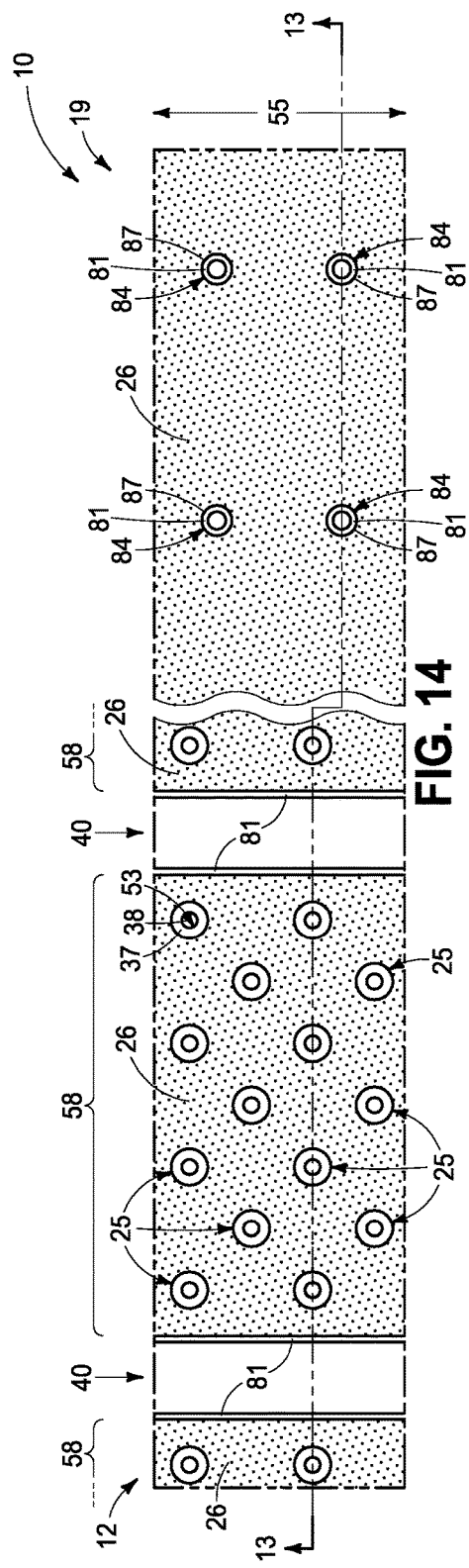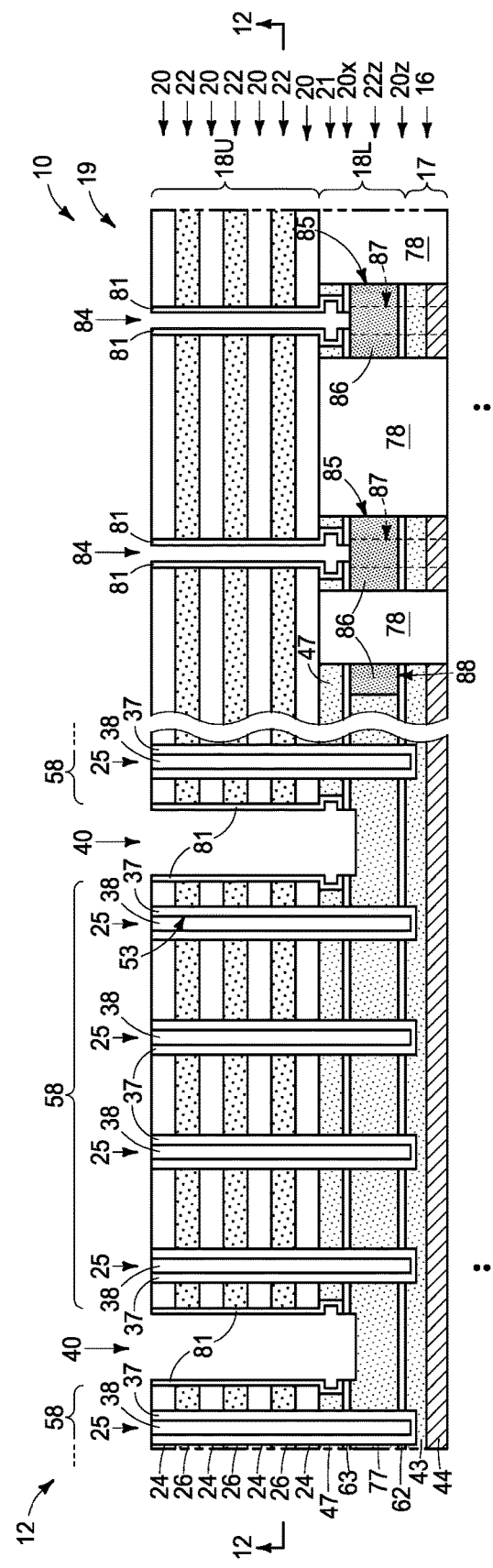

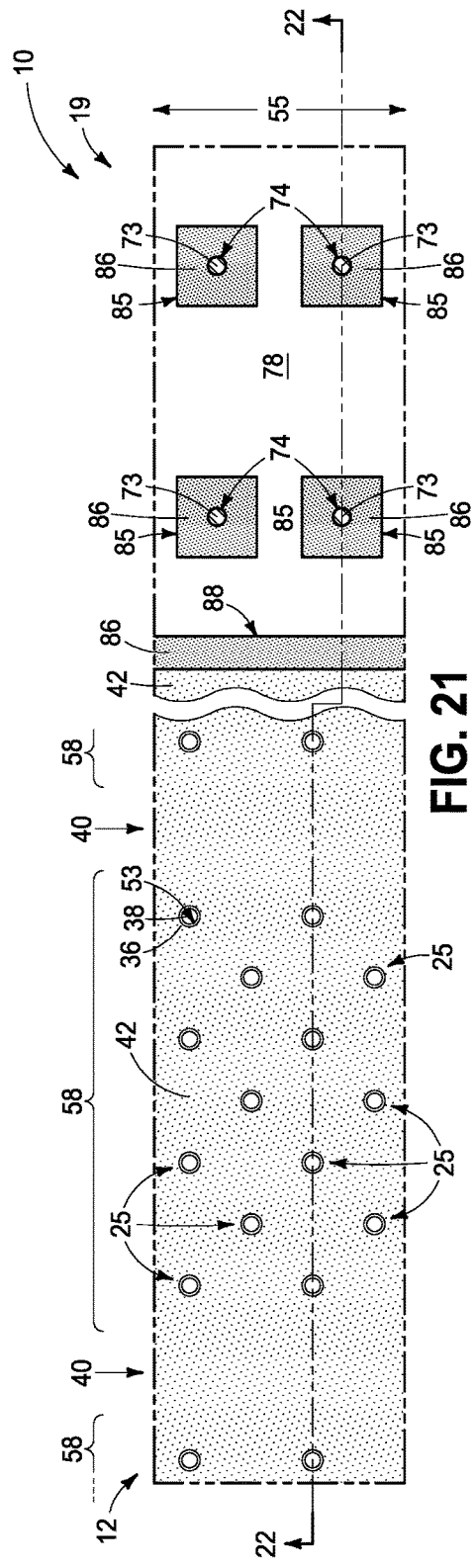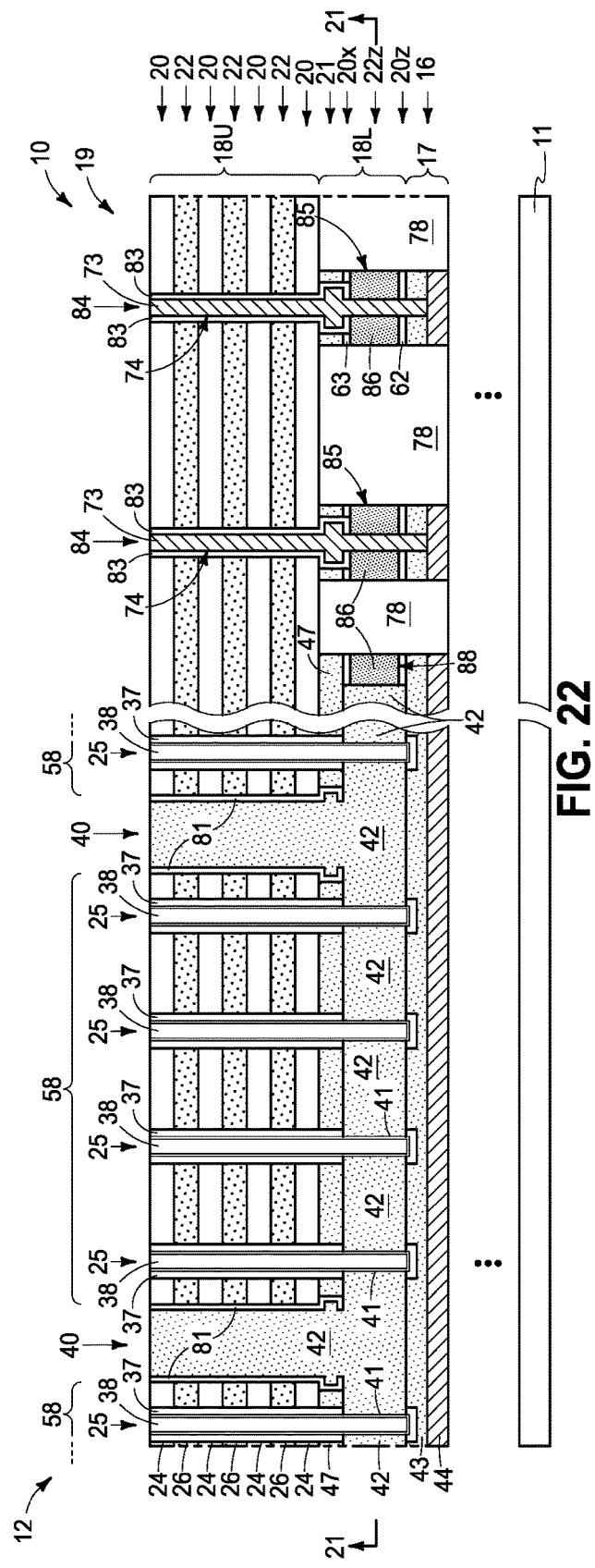

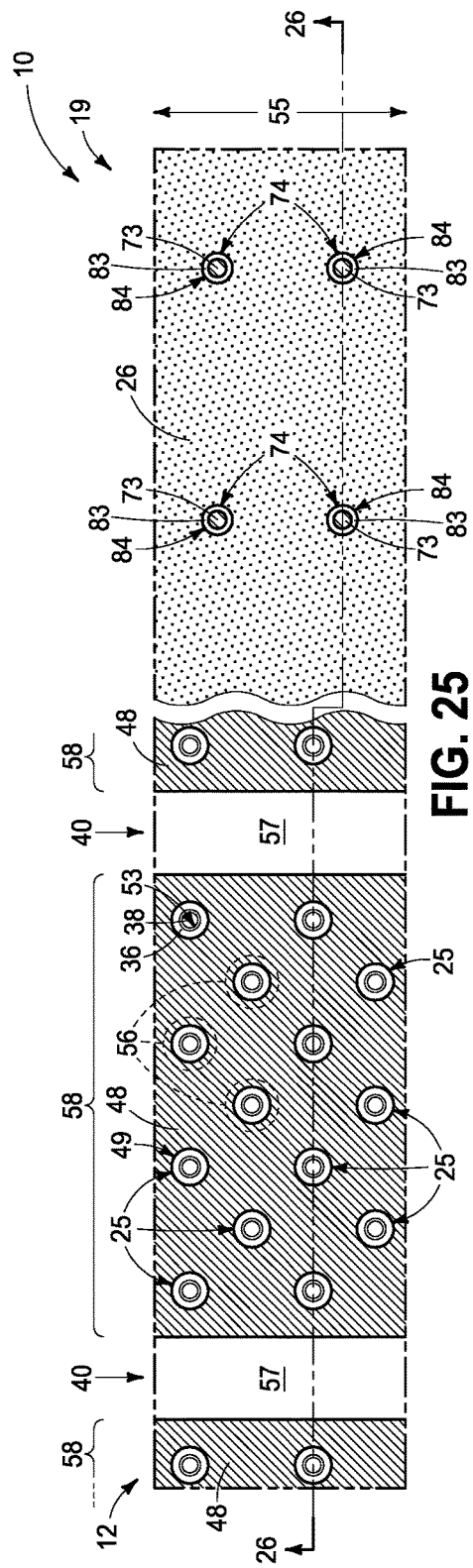

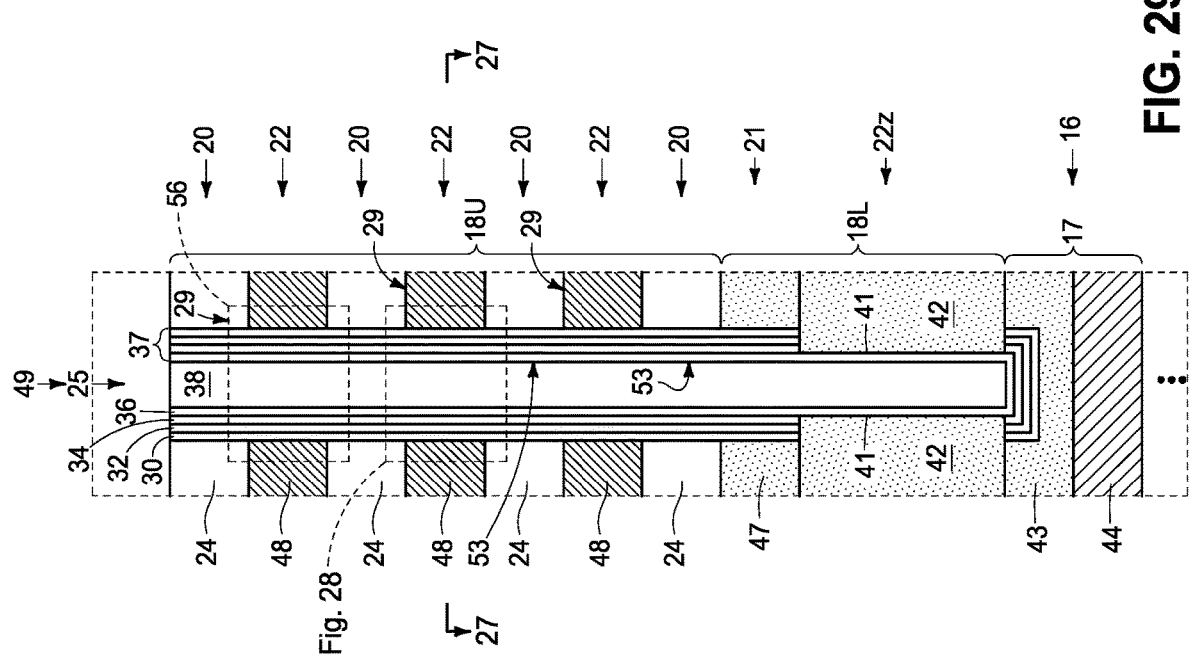
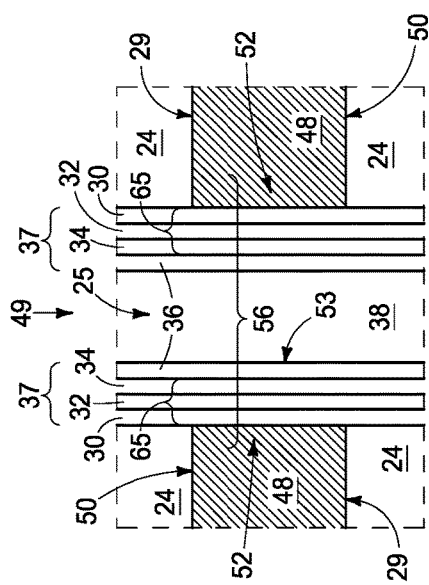

MEMORY ARRAYS COMPRISING STRINGS OF MEMORY CELLS AND METHODS USED IN FORMING A MEMORY ARRAY COMPRISING STRINGS OF MEMORY CELLS

RELATED PATENT DATA

This patent resulted from an application claiming priority to U.S. Provisional Patent Application Ser. No. 63/239,543, filed Sep. 1, 2021, entitled "Memory Arrays Comprising Strings Of Memory Cells And Methods Used In Forming A Memory Array Comprising Strings Of Memory Cells", naming Alyssa N. Scarbrough, John D. Hopkins, Chet E. Carter, Justin D. Shepherdson, Collin Howder, and Joshua Wolanyk as inventors, the disclosure of which is incorporated by reference.

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 2 and 3 are diagrammatic cross-sectional views of portions of a construction (e.g., as part of FIG. 1) that will comprise an array of elevationally-extending strings of memory cells in accordance with an embodiment of the invention.

FIGS. 4-37 are diagrammatic sequential sectional and/or enlarged views of the construction of FIGS. 2 and 3, or portions thereof or alternate and/or additional embodiments, in process in accordance with some embodiments of the invention.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-37 which may be considered as a "gate-last" or "replacement-gate" process. Further, and regardless, the following sequence of processing steps is but one example and other sequences of the example processing steps (with or without other processing steps) may be used regardless of whether using "gate-last/replacement-gate" processing.

Figure 1:
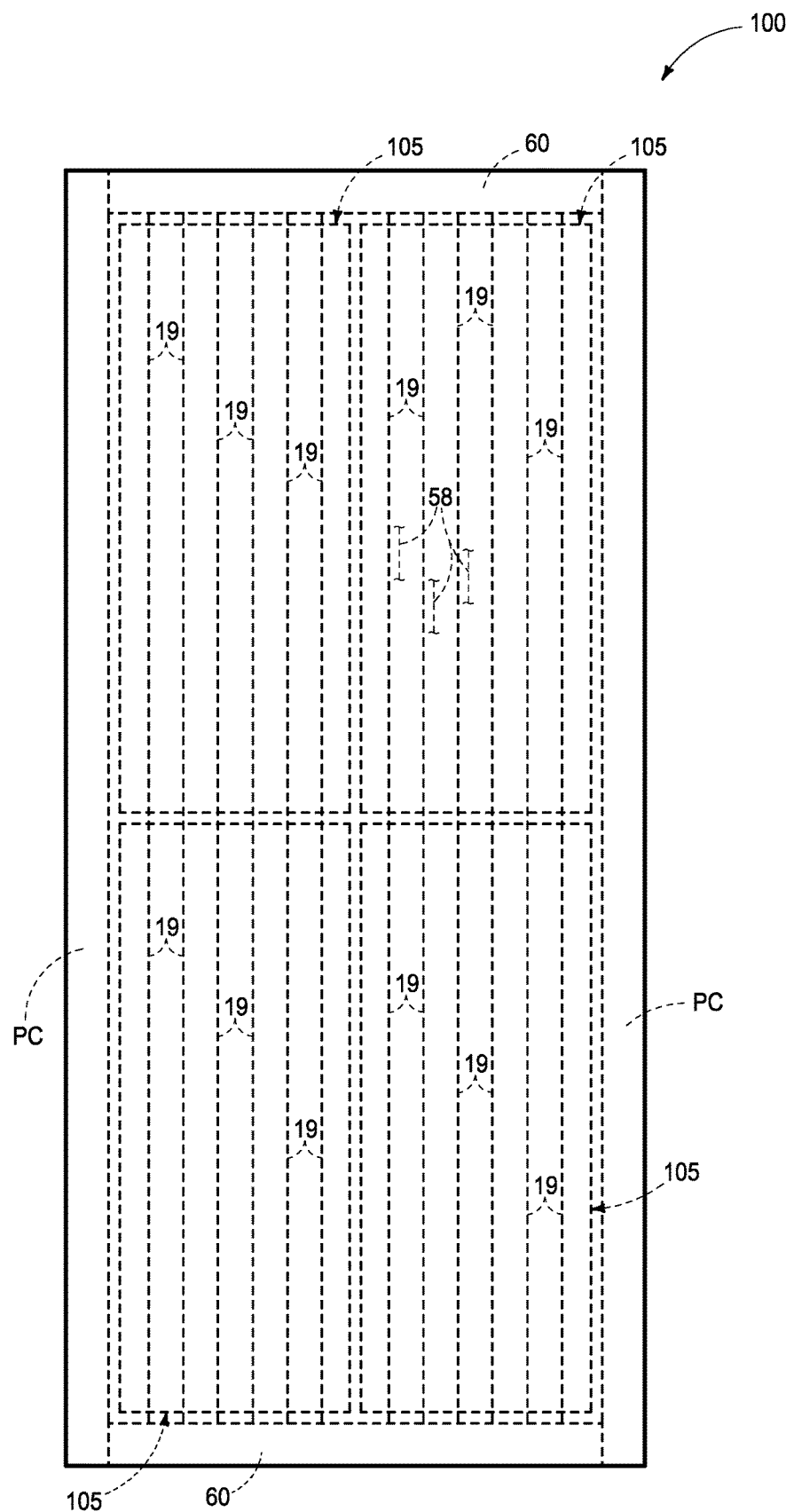
FIG. 1 is a diagrammatic top plan view of a die or die area that may be part of a larger substrate (e.g., a semiconductor wafer, and not shown).

FIG. 1 shows an example diagrammatic embodiment comprising a die or die area 100 that may be part of a larger substrate (e.g., a semiconductor wafer, and not shown) and within which a memory array will be fabricated. Example die area 100 comprises at least one memory-plane region 105 (four being shown), memory-block regions 58 in individual memory-plane regions 105, a stair-step region 60 (two being shown at longitudinal ends of the memory planes), and a peripheral circuitry region PC (two being shown). In this document, "block" is generic to include "sub-block". Alternate orientations may be used, for example having a stair-step region between immediately-adjacent memory planes (not shown). Regions 105, 58, 60, and/or PC may not be discernable at this point of processing. FIGS. 2 and 3 are diagrammatic larger and varied scale views of portions of die area 100.

Referring to FIGS. 2 and 3, a construction 10 is shown in a method of forming an array or array region 12 of elevationally-extending strings of transistors and/or memory cells (not yet fabricated) and in forming a through-array-via (TAV) region 19. A "TAV region" is a region in which operative TAVs are present or will be formed. An "operative TAV" is a circuit-operative conductive interconnect extending through a stack 18* (described below; an * being used as a suffix to be inclusive of all such same-numerically-designated components that may or may not have other suffixes) and between electronic components at different elevations in a finished construction of integrated circuitry that has been or is being fabricated. A TAV region may also contain one or more dummy TAVs (i.e., a circuit-inoperative structure extending through a stack 18* in a finished construction of integrated circuitry that has been or is being fabricated). Example TAV region 19 may be in individual memory planes 105 (i.e., in-plane; e.g., FIG. 1) or be out-of-plane (i.e., outside of a memory-plane region [not shown]; e.g., edge-of-plane or in a stair-step region 60). By way of example only, example in-plane TAV regions 19 are so-designated in FIG. 1. The discussion proceeds with respect to a single TAV region 19, although likely multiple TAV regions to which the invention is applicable will exist and whether those multiple TAV regions are in-plane, out-of-plane, and/or a combination of in-plane and out-of-plane. A TAV region may be within a memory-block region (not shown).

Example construction 10 comprises a base substrate 11 comprising conductive/conductor/conducting, semiconductive/semiconductor/semiconducting, and/or insulative/insulator/insulating electrically herein) materials. Various materials have been formed elevationally over base substrate 11. Materials may be aside, elevationally inward, or elevationally outward of the FIGS. 2 and 3—depicted materials. For example, other partially or wholly fabricated components of integrated circuitry may be provided somewhere above, about, or within base substrate 11. Control and/or other peripheral circuitry for operating components in an array (e.g., array 12 or memory-array region 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed within array 12.

In one embodiment, a lower portion 18L of a stack 18* has been formed above substrate 11 and conductor tier 16. Stack 18* will comprise vertically-alternating conductive tiers 22* and insulative tiers 20*, with material of tiers 22* being of different composition from material of tiers 20* (only one tier 22z and one tier 20z being shown at this point of the example processing). Lower portion 18L comprises laterally-spaced memory-block regions 58 as part of one of memory-plane regions 105 and that will comprise laterally-spaced memory blocks 58 in a finished circuitry construction. In this document, unless otherwise indicated, "block" is generic to include "sub-block". Memory-block regions 58 and resultant memory blocks 58 (not yet shown) may be considered as being longitudinally elongated and oriented, for example, horizontally-parallel relative one another along a direction 55. Memory-block regions 58 may not be discernable at this point of processing. Lower portion 18L comprises a TAV region (e.g., 19).

Conductive tier(s) 22* (alternately referred to as first tiers) may not comprise conducting material and insulative tier(s) 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20z of second tiers 20* directly above (e.g., directly against) conductor material 17. Example lowest second tier 20z is insulative and may be sacrificial (e.g., comprising material 62, for example silicon dioxide and/or silicon nitride). A lowest tier 22z of first tiers 22* comprising sacrificial material 77 (e.g., polysilicon or silicon nitride) is above lowest second tier 20z.

In one embodiment, an island 85 comprising etch-resistant material 86 has been formed in lowest first tier 22z in locations 87 that will be directly below individual TAV openings to-be-formed. The etch-resistant material comprises a composition that is etch resistant to an etching fluid, the etching fluid and the composition being referred to below. In one embodiment, a wall 88 has been formed in lowest first tier 22z, with such being horizontally-elongated longitudinally-along one of memory-block regions 58 and being in TAV region 19. Wall 88 may be formed directly against a memory-block region 58 (not shown) including, for example, partially there-within (not shown). Wall 88 comprises etch-resistant material (e.g., 86) that is etch resistant to the etching fluid and that may be of the same or different composition from that of island 85 when both island(s) 85 and wall(s) 88 are formed. By way of example only, methods of forming island(s) 85 and wall(s) 88 include ion implantation or diffusion doping through openings in a masking material (not shown) formed directly above sacrificial material 77.

Figure 4:
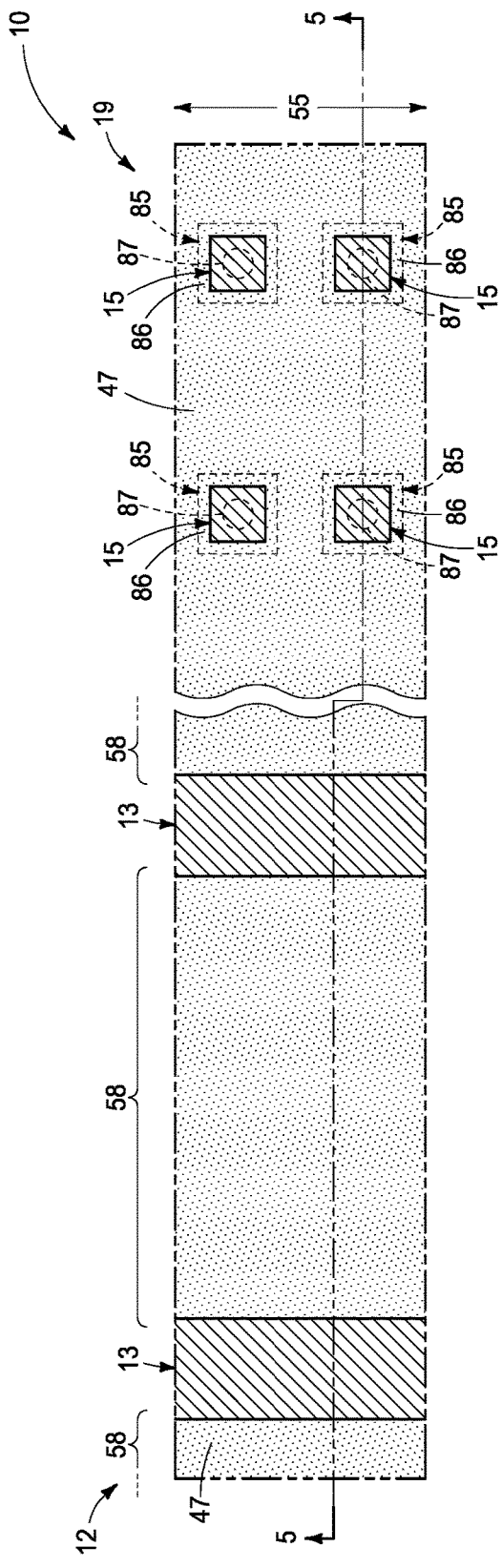
Figure 5:
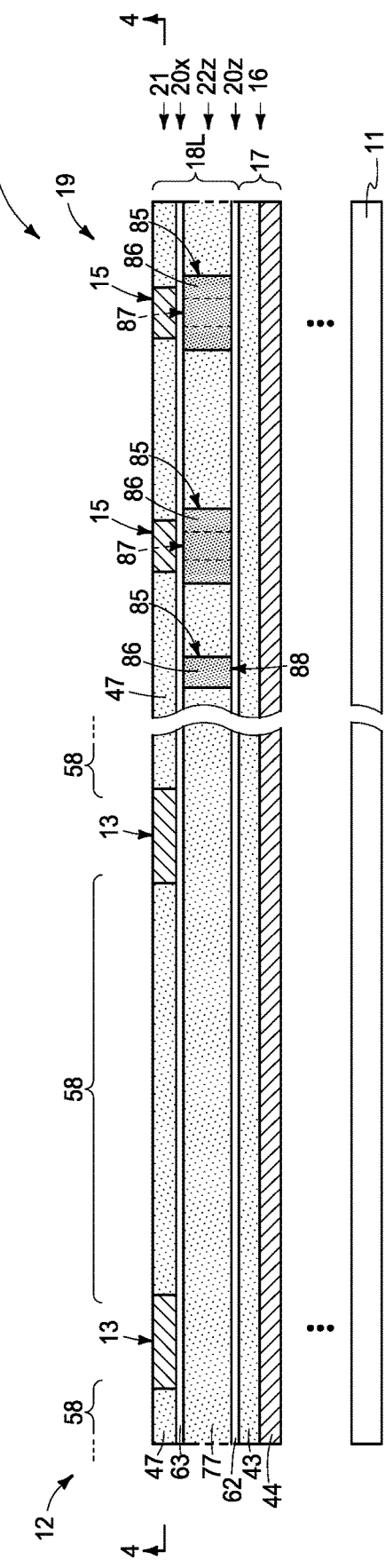

Referring to FIGS. 4 and 5, and in one embodiment, a next-lowest second tier 20x of second tiers 20* has been formed directly above lowest second tier 20z and lowest first tier 22z (e.g., comprising material 63, for example silicon dioxide and/or silicon nitride). A conducting-material tier 21 comprising conducting material 47 (e.g., conductively-doped polysilicon) has been formed directly above next-lowest second tier 20x. Additional tiers may be present. Example conducting-material tier 21 comprises sacrificial rails 13 that are individually between immediately-laterallyadjacent memory-block regions 58 (e.g., directly under where trenches will be formed as described below). Example conducting-material tier 21 comprises sacrificial islands 15 above islands 85. Sacrificial rails 13 and sacrificial islands 15 may taper laterally-inward or laterally-outward moving deeper into lower stack portion 18L (not shown). Material of sacrificial rails 13 and sacrificial islands 15 may comprise conductive material (e.g., comprising one or both of conductively-doped semiconductor material or metal material), insulative material, and/or semiconductive material.

Referring to FIGS. 6 and 7, materials 44, 43, 62, 77, 63, and 47 have been patterned (e.g., by photolithographic patterning and etch) in TAV region 19 as shown, and void space left thereby filled with insulator material 78 (e.g., silicon dioxide and/or silicon nitride, by overfilling such void space and planarizing such back at least to a top surface of remaining material 47). In one embodiment and as shown, insulator material 78 is directly against islands 85 and wall 88. Optional sacrificial etch-stop plugs (not shown) may be formed in lower portion 18L in memory-block regions 58 in horizontal locations where channel openings will later be formed.

Referring to FIGS. 8-11, an upper portion 18U of stack 18* has been formed above lower portion 18L. Upper portion 18U comprises vertically-alternating different composition first tiers 22 and second tiers 20. First tiers 22 may be conductive and second tiers 20 may be insulative, yet need not be so at this point of processing in conjunction with the hereby initially-described example method embodiment which is "gate-last" or "replacement-gate". Example first tiers 22 and second tiers 20 comprise different composition materials 26 and 24 (e.g., silicon nitride and silicon dioxide), respectively. Example upper portion 18U is shown starting above lower portion 18L with a second tier 20 although such could alternately start with a first tier 22 (not shown). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22 and/or above an uppermost of conductive tiers 22. For example, one or more select gate tiers (not shown) may be between conductor tier 16 and lowest conductive tier 22 and one or more select gate tiers may be above an uppermost of conductive tiers 22. Alternately or additionally, at least one of the depicted uppermost and lowest conductive tiers 22 may be a select gate tier.

Channel openings 25 have been formed (e.g., by etching) through second tiers 20 and first tiers 22 in upper portion 18U to conductor tier 16 in lower portion 18L (e.g., at least to lowest first tier 22z) in lower portion 18L. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest second tier 20z. A reason for extending channel openings 25 at least to conductor material 17 of conductor tier 16 is to provide an anchoring effect to material that is within channel openings 25. Etch-stop material/plugs (not shown) may be within or atop conductive material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductor material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

In one embodiment and as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 will be prior to forming upper portion 18U. Channel openings 25 may then be formed by etching materials 24 and 26 to stop on or within the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

Referring to FIGS. 12 and 13, horizontally-elongated trenches 40 have been formed (e.g., by anisotropic etching) into stack 18* through upper portion 18U to lower portion 18L and that are individually between immediately-laterally-adjacent memory-block regions 58. Trenches 40 may extend to sacrificial rails 13 (when present) and, if so, such may provide an etch stopping function when trenches 40 are formed by etching, whereby such etching is conducted selectively relative to the material of sacrificial rails 13. Trenches 40 may taper laterally-inward or laterally-outward moving deeper into stack 18* (not shown). By way of example and for brevity only, channel openings 25 are shown as being arranged in groups or columns of staggered rows of three and four channel openings 25 per row. Trenches 40 will typically be wider than channel openings 25 (e.g., 3 to 10 times wider). Any alternate existing or future-developed arrangement and construction may be used. One or more trenches 40 may be formed directly against TAV region 19 (not shown) including, for example, partially there-within (not shown). Alternately, a trench 40 that is closest to TAV region 19 may be laterally spaced therefrom (as shown).

TAV openings 84 have been formed into upper portion 18L in TAV region 19. TAV openings 84 may extend to sacrificial islands 15 (when present) and, if so, such may provide an etch stopping function when TAV openings 84 are formed by etching, whereby such etching is conducted selectively relative to the material of sacrificial islands 15. TAV openings 84 may ultimately go to, through, or only into conductor tier 16. TAV openings 84 may taper laterally-inward or laterally-outward moving deeper into stack 18* (not shown).

Trenches 40, channel openings 25, and TAV openings 84 (and/or material subsequently formed therein) may be formed in any order relative the other or at the same time or at one or more different times.

Referring to FIGS. 14 and 15, sacrificial rails 13 and sacrificial islands 15 (neither being shown) have been removed (e.g., by isotropic etching) and thereafter a thin sacrificial liner 81 (e.g., hafnium oxide, aluminum oxide, multiple layers of silicon dioxide and silicon nitride, etc.) has been formed, followed by punch-etching there-through to expose material 63, and followed by punch-etching through material 63 to expose material 77.

Figure 16:
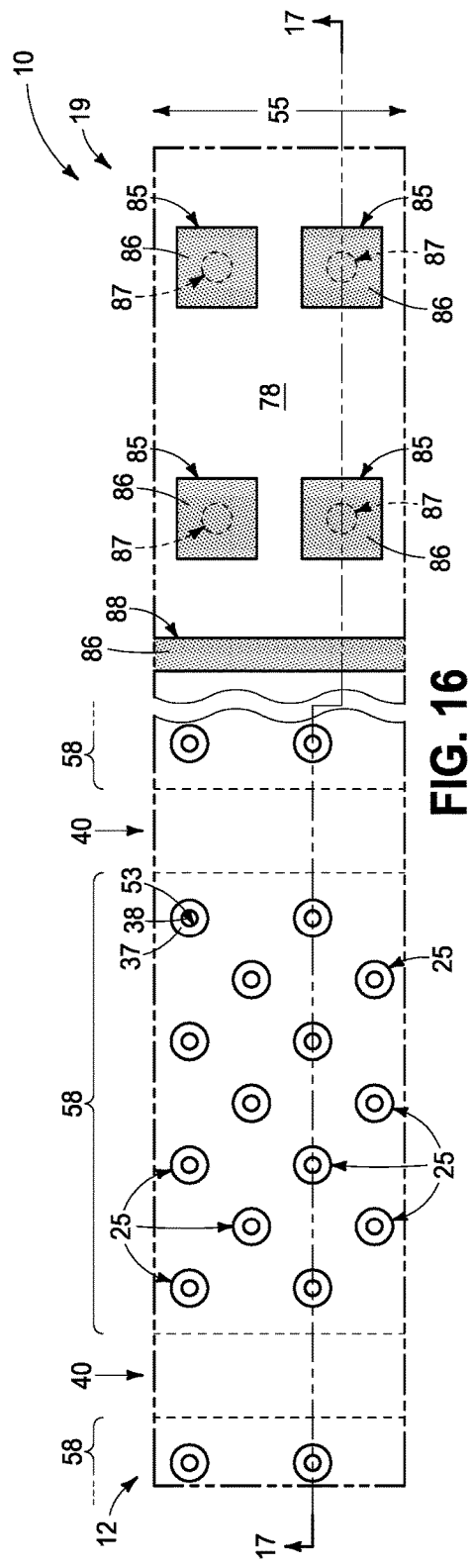
Figure 17:
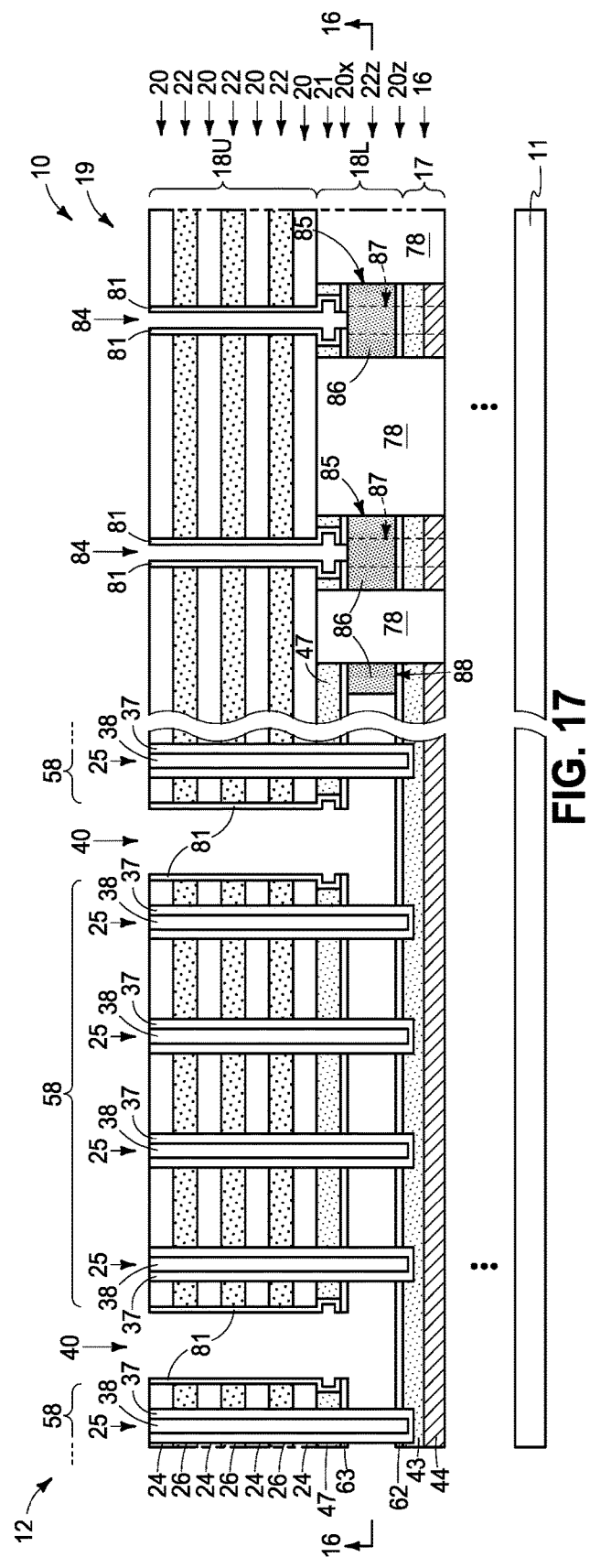

Referring to FIGS. 16 and 17, an etching fluid (not shown) has been flowed into TAV openings 84 and into horizontally-elongated trenches 40 to isotropically etch sacrificial material 77 (not shown). Such etching is ideally conducted selectively relative to other exposed materials, for example using liquid or vapor $H_3PO_4$ as a primary etchant where material 77 is silicon nitride or using tetramethyl ammonium hydroxide [TMAH] where material 77 is polysilicon. The artisan is capable of selecting other chemistries for other materials 77. Etch-resistant material 86 is etch resistant to the etching fluid used during the flowing. In one embodiment, etch-resistant material 86 comprises dopant therein at a total dopant concentration of 0.01 to 30 atomic percent. In one embodiment, the dopant is B, C, O, Ga, or N (at least one). In one embodiment, etch-resistant material 86 comprises a primary material (e.g., polysilicon) having the dopant therein. In one embodiment, a radially-outermost portion of island 85 is circumferentially about its TAV opening there-above radially-outward thereof.

In one embodiment, directly below TAV openings 84, the etching fluid does not contact sacrificial material 77 in lowest first tier 22z during the such flowing. In one embodiment, directly below TAV openings 84, the etching fluid contacts etch-resistant material 86 of islands 85 during such flowing. In one embodiment where etch-resistant wall 88 is formed, the etching fluid contacts the etch-resistant material (e.g., 86) of wall 88 during the flowing of the etching fluid through one of horizontally-elongated trenches 40 (e.g., laterally from the left as shown in FIGS. 16 and 17.

Figure 18:
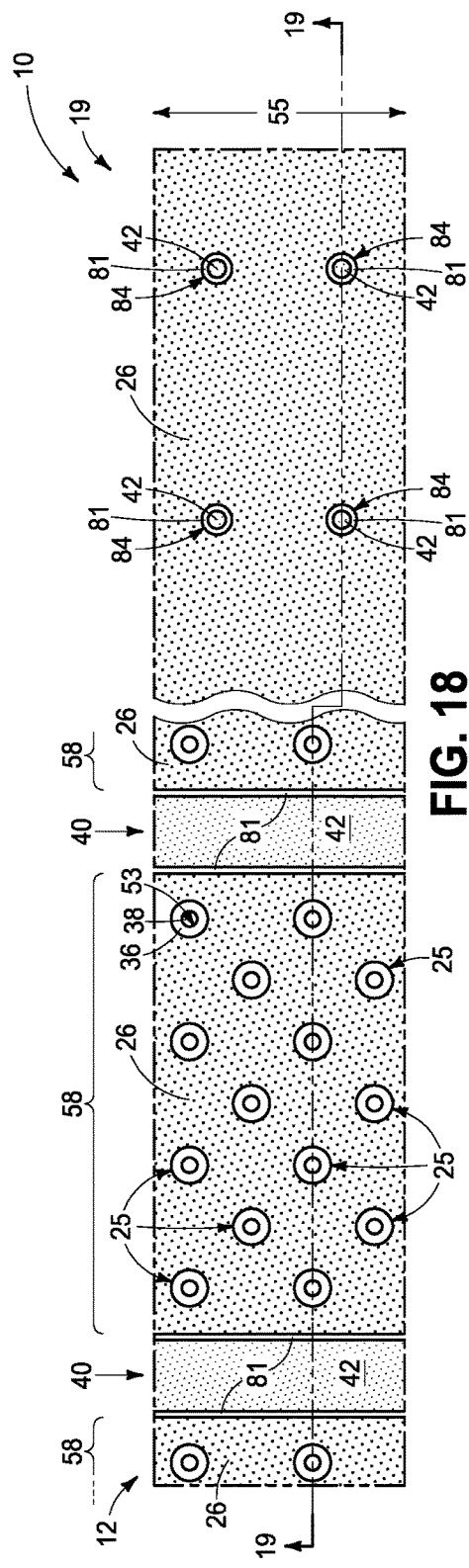
Figure 19:
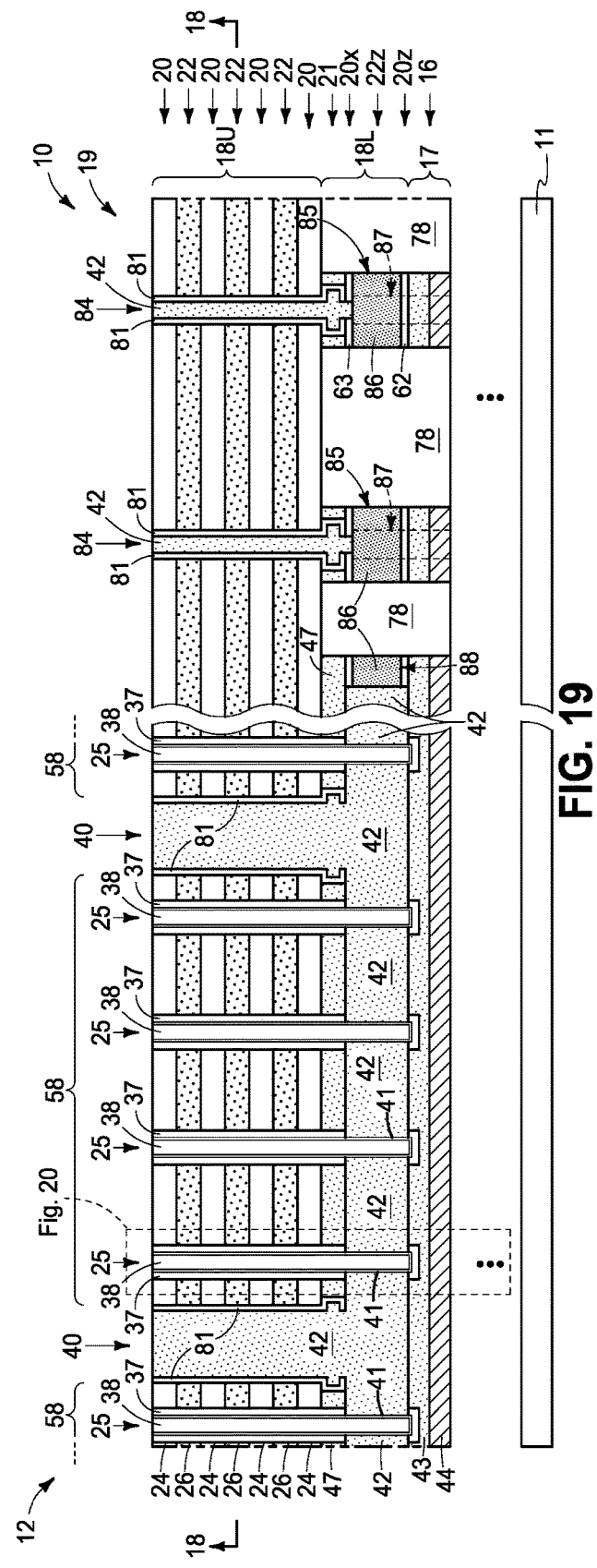
Figure 20:
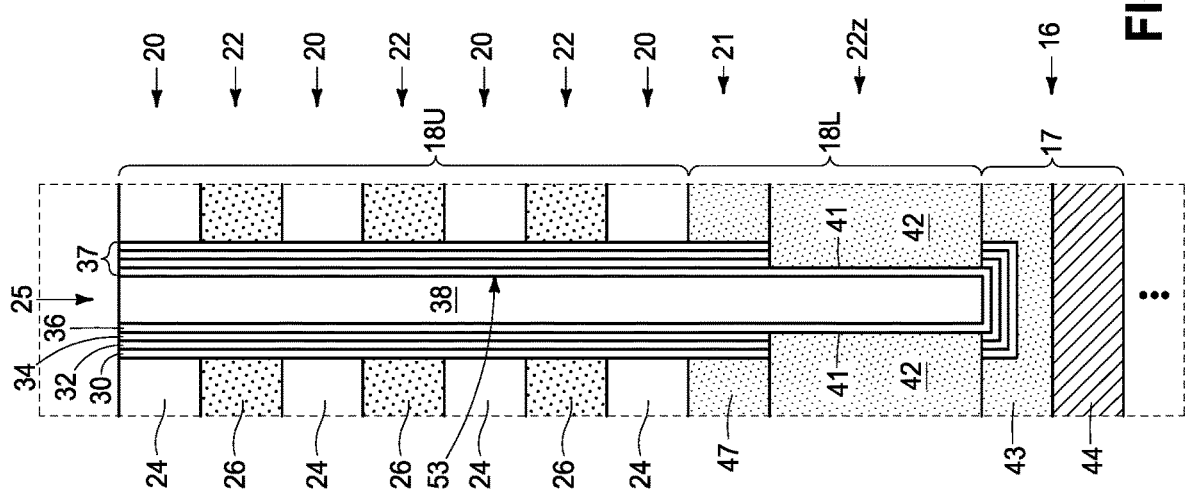

Referring to FIGS. 18-20, and in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 81 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment and as shown, such etching has been conducted selectively relative to liner 81 (when present). In one embodiment, materials 62 and 63 (not shown in memory-block regions 58) are also removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired.

After exposing sidewall 41, conducting material 42 (e.g., conductively-doped polysilicon) has been formed in lowest first tier 22z and in one embodiment directly against sidewall 41 of channel material 36. In one embodiment, conducting material 42 is formed to at least predominantly (i.e., more than 50% up to and including 100%) fill remaining volume of TAV openings 84 and remaining volume of trenches 40. In one embodiment and as shown, such has been formed directly against a bottom of conducting material 47 of conducting-material tier 21 and directly against a top of conductor material 43 of conductor tier 16, thereby directly electrically coupling together channel material 36 of individual channel-material strings 53 with conductor material 43 of conductor tier 16 and conducting material 47 of conducting-material tier 21.

Referring to FIGS. 21 and 22, conducting material 42 and liner 81 (not shown) have been removed from TAV openings 84 (e.g., if previously formed therein) and an insulator lining 83 formed therein. Material 26 in tiers 22 may be laterally recessed before forming insulator lining 83 (not shown). Conducting material 42 in trenches 40 may be masked (masking material thereof not being shown) during processing associated with TAV openings 84. Alternately, lining 81 might be insulative and remain (not shown) regardless of whether forming insulator lining 83. FIGS. 21 and 22 show TAV openings 84 as having been extended (e.g., by anisotropic etching through islands 85) to lower conductor material 44 after removing of conducting material 42 from TAV openings 84. Alternately, and by way of example only, TAV openings 84 could be extended before forming insulator lining 83, such insulator lining formed thereafter, and, regardless, TAV openings 84 could be extended through conductor tier 16 to circuitry there-below (none of which is shown). Thereafter, conductive material 73 (e.g., a TiN lining having W radially-inward thereof) has been formed in individual TAV openings 84 to form a TAV 74. Accordingly, and in one embodiment, TAVs 74 are formed in individual TAV openings 84 after forming conducting material 42.

Any other attribute(s) or aspect(s) as shown and/or described herein with respect to other embodiments may be used.

In one embodiment, a method used in forming a memory array (e.g., 12) comprising strings (e.g., 49) of memory cells (e.g., 56) comprises forming a conductor tier (e.g., 16) comprising conductor material (e.g., 17) on a substrate. A stack (e.g., 18*) comprising vertically-alternating first tiers (e.g., 22*) and second tiers (e.g., 20*) is formed above the conductor tier. The stack comprises laterally-spaced memory-block regions (e.g., 58) and a TAV region (e.g., 19). A lowest of the first tiers (e.g., 22z) comprises sacrificial material (e.g., 77). The stack comprises channel-material strings (e.g., 53) extending through the first tiers and the second tiers (i.e., ultimately comprising said strings). The stack comprises horizontally-elongated trenches (e.g., 40) extending through the first tiers and the second tiers to the sacrificial material in the lowest first tier and that are individually between immediately-laterally-adjacent of the memory-block regions. The stack comprises TAV openings (e.g., 84) in the TAV region. An etching fluid is flowed into the TAV openings and into the horizontally-elongated trenches to isotropically etch the sacrificial material. After the isotropically etching and through the horizontally-elongated trenches, conducting material (e.g., 42) is formed and that directly electrically couples together channel material (e.g., 36) of the channel-material strings and the conductor material of the conductor tier. Any other attribute(s) or aspect(s) as shown and/or described herein with respect to other embodiments may be used.

Figure 23:
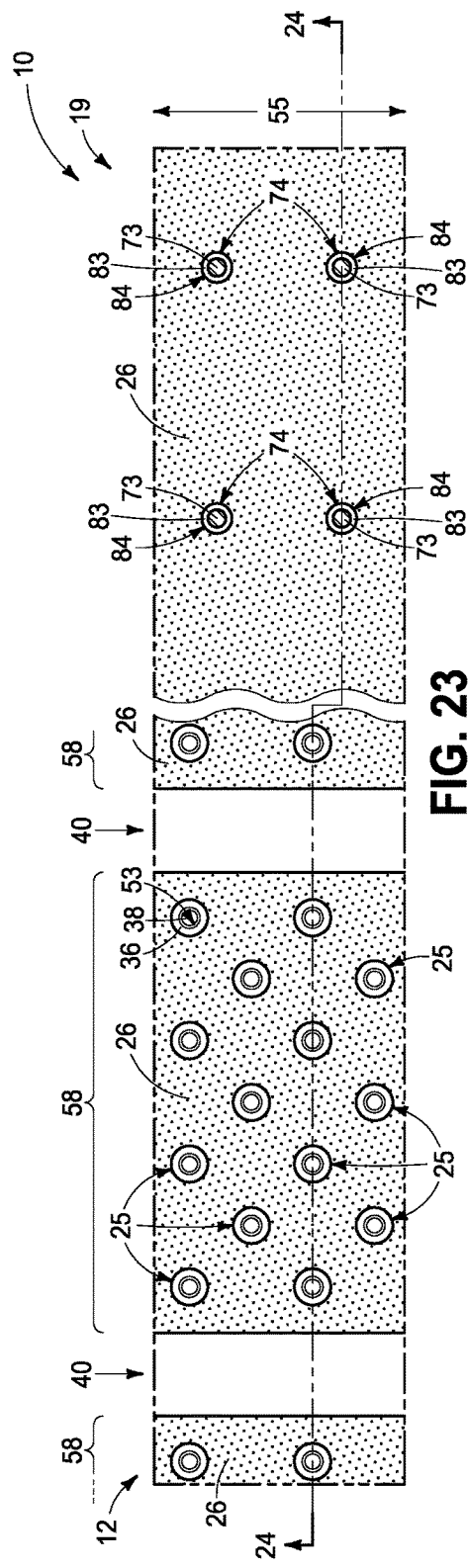
Figure 24:
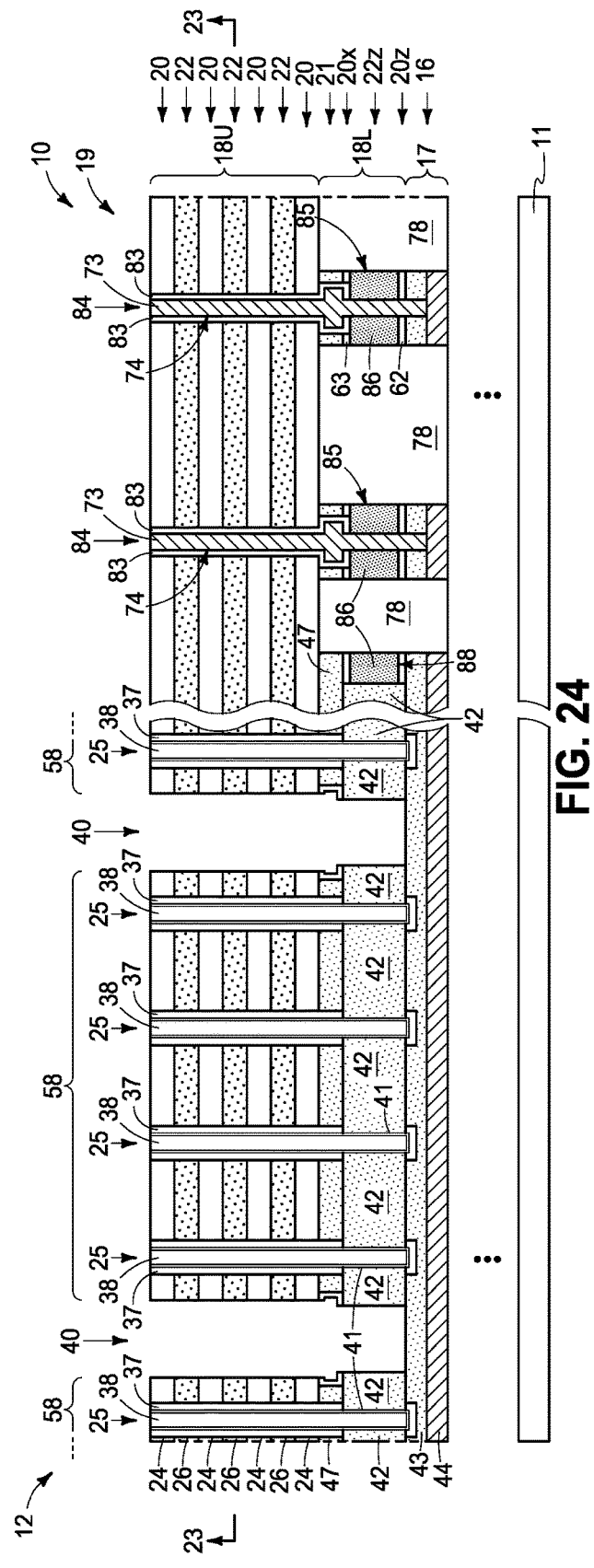
Figure 30:
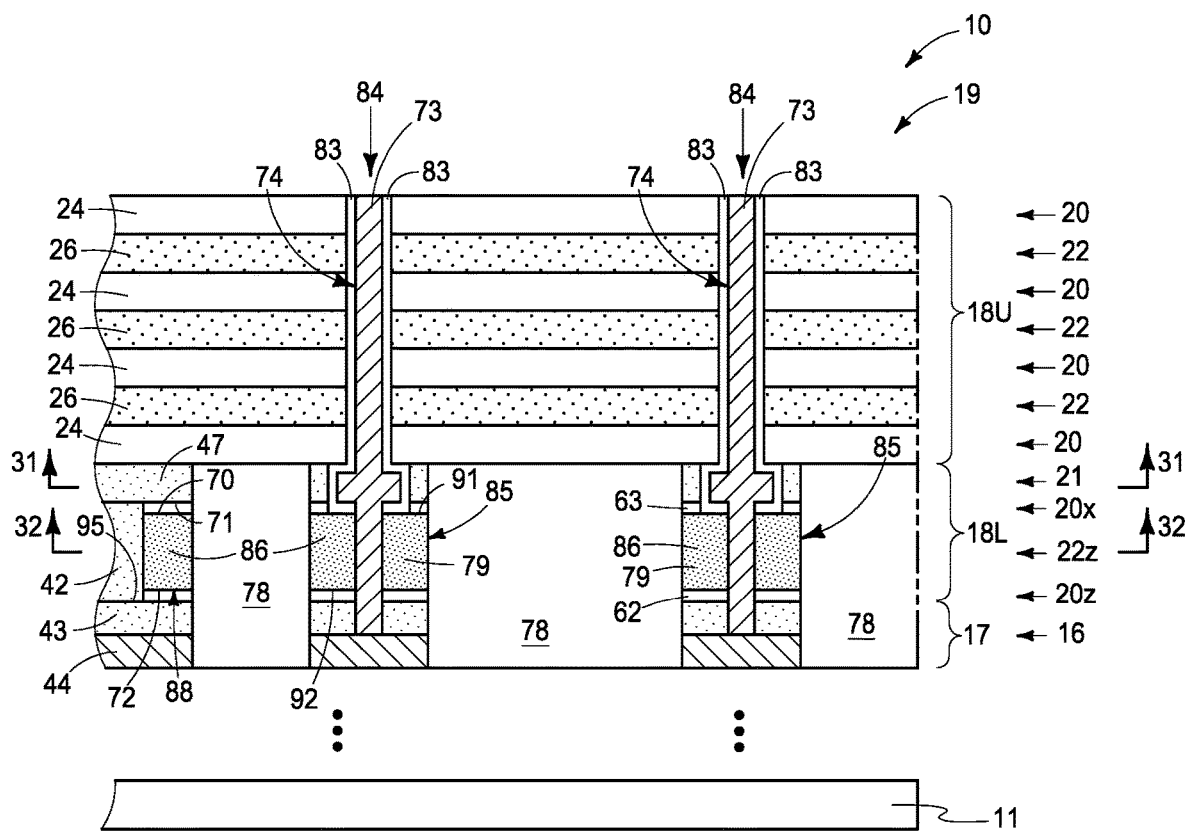

Referring to FIGS. 23 and 24, conducting material 42 has been removed from trenches 40 as has sacrificial liner 81 (not shown). Sacrificial liner 81 may be removed before or after forming conducting material 42.

Referring to FIGS. 25-32, material 26 of conductive tiers 22 in array region 12 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 in conductive tiers 22 in array region 12 in the example embodiment is sacrificial and has been replaced with conducting material 48, and which has thereafter been removed from trenches 40, thus forming individual conductive lines 29 (e.g., word-lines) and elevationally-extending strings 49 of individual transistors and/or memory cells 56.

Some, all, or none of material 26 may be removed from TAV region 19 (no removal therefrom being shown) and replaced with conducting material 48, for example depending on proximity of trenches 40 that are closest thereto and/or presence or lack thereof of etch-blocking material(s)/structure(s) in tiers 22 in upper portion 18U (not shown).

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In this document, "undoped" is a material having from 0 atoms/cm$^3$ to $1 \times 10^{12}$ atoms/cm$^3$ of atoms of conductivity-increasing impurity in said material. In this document, "doped" is a material having more than $1 \times 10^{12}$ atoms/cm$^3$ of atoms of conductivity-increasing impurity therein and "conductively-doped" is material having at least $1 \times 10^{18}$ atoms/cm$^3$ of atoms of conductivity-increasing impurity therein. Intervening material 57 may include through array vias (not shown).

Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) above a conductor tier (e.g., 16). The strings of memory cells comprise channel-material strings (e.g., 53) that extend through the insulative tiers and the conductive tiers. The channel-material strings directly electrically couple with conductor material (e.g., 17) of the conductor tier by conducting material (e.g., 42) that is in a lowest of the conductive tiers (e.g., 22z) and that is directly against multiple of the channel-material strings. A wall (e.g., 88) is in the lowest conductive tier aside the conducting material. The wall is horizontally-elongated longitudinally-along one of the memory blocks and is in a TAV region (e.g., 19).

In one embodiment, the wall is directly against the conducting material. In one embodiment, the wall and the conducting material comprise a same primary material, with the same primary material of the wall being doped with a substance and the same primary material of the conducting material comprising less, if any, of the substance than does the same primary material of the wall. In one such embodiment, the primary material is polysilicon and the substance is B, C, O, Ga, or N. In one embodiment, the wall has a top (e.g., 70 in FIG. 30) that is at or below a bottom (e.g., 71) of a next-lowest conductive tier (e.g., 21) that is directly above the lowest conductive tier. In one embodiment, the wall has a bottom (e.g., 72) that is at or above a top e.g., 95) of the conductor tier.

Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) above a conductor tier (e.g., 16). The strings of memory cells comprise channel-material strings (e.g., 53) that extend through the insulative tiers and the conductive tiers. The channel-material strings directly electrically couple with conductor material (e.g., 17) of the conductor tier by conducting material (e.g., 42) that is in a lowest of the conductive tiers (e.g., 22z) and that is directly against multiple of the channel-material strings. A TAV region (e.g., 19) comprises TAVs (e.g., 74) that individually extend through the lowest conductive tier and into the conductor tier. Individual of the TAVs in the lowest conductive tier comprise a conductive core (e.g., material 73) having an annulus circumferentially there-about (e.g., 79; e.g., that has straight radially-outer sides). The annulus has dopant therein at a total dopant concentration of 0.01 to 30 atomic percent. Insulative material (e.g., 78) in the lowest conductive tier is circumferentially about the annulus and between immediately-adjacent of the TAVs.

In one embodiment, the total dopant concentration is 1.0 to 30.0 atomic percent and in one such embodiment is 1.0 to 10.0 atomic percent. In one embodiment, the annulus and the conducting material comprise a same primary material, with the same primary material of the conducting material comprising less, if any, of the dopant than does the same primary material of the annulus. In one such embodiment, the primary material is polysilicon and the dopant is B, O, Ga, or N.

Figure 31:
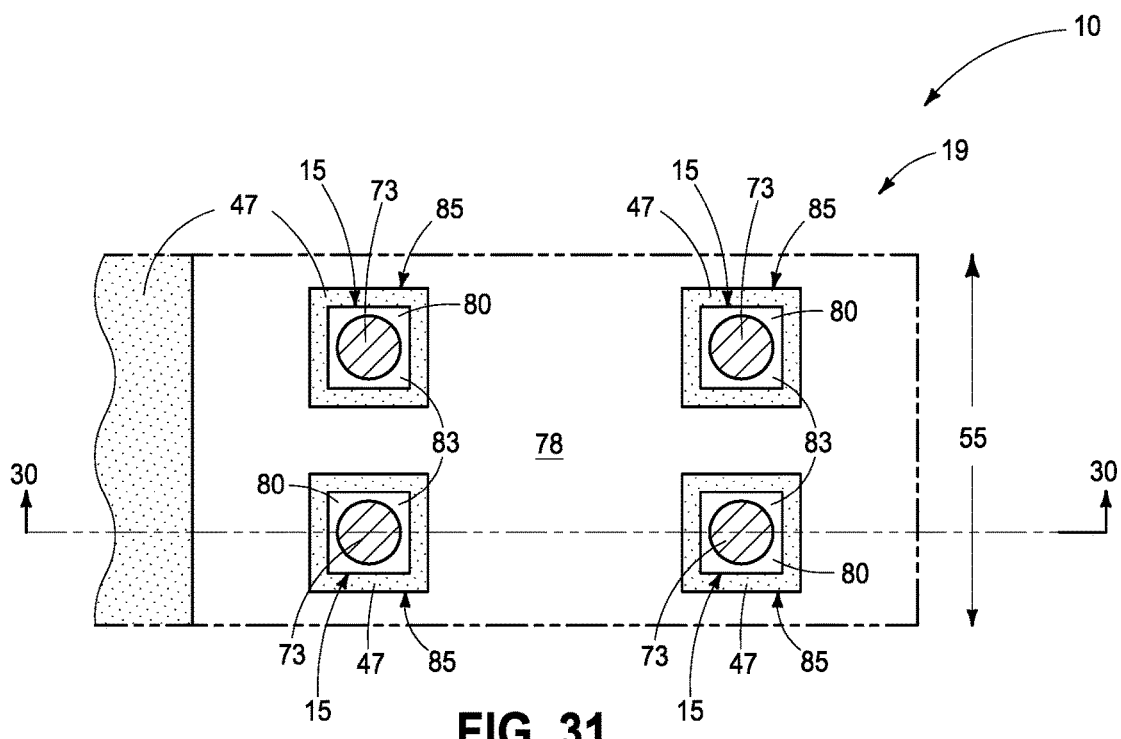
Figure 32:
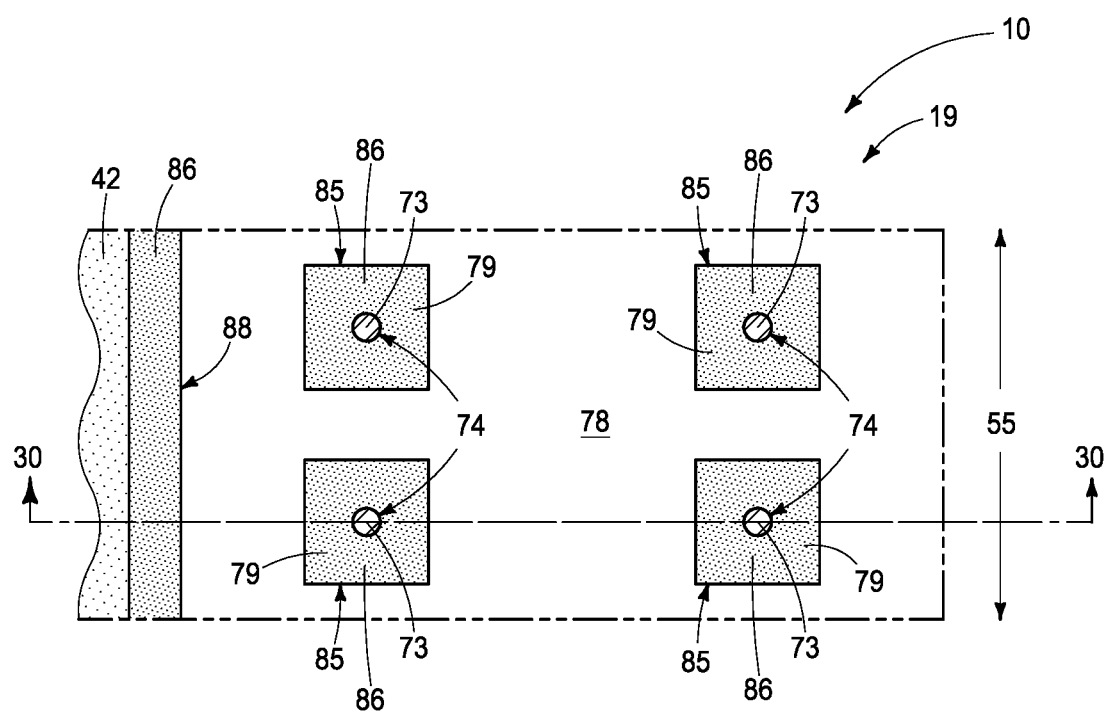

In one embodiment, individual of the TAVs in a next-lowest conductive tier (e.g., 21) that is directly above the lowest conductive tier comprise the conductive core having another annulus circumferentially there-about (e.g., 80 in FIG. 31; e.g., that has straight radially-outer sides). In one such embodiment, the another annulus is of different composition (e.g., 83) from that (e.g., 86) of the annulus in the lowest conductive tier. In one embodiment, the another annulus is radially smaller (i.e., in maximum diameter) than the annulus in the lowest conductive tier. In one embodiment, the another annulus and the annulus in the lowest conductive tier are directly against one another.

In one embodiment, the annulus has a top (e.g., 91 in FIG. 30) that is at or below a bottom (e.g., 71) of a next-lowest conductive tier (e.g., 21) that is directly above the lowest conductive tier. In one embodiment, the annulus has a bottom (e.g., 92) that is at or above a top (e.g., 95) of the conductor tier.

Any other attribute(s) or aspect(s) as shown and/or described herein with respect to other embodiments may be used.

In one embodiment, the above example processing comprises replacing conducting material 42 in TAV openings 84 with conductive material 73 to form TAV 74 in individual TAV openings 84, replacing conducting material 42 in trenches 40 with intervening material 57, and wherein such occurs in TAV openings 84 before occurring in trenches 40. In another embodiment, the replacing of the conducting material in the TAV openings occurs after the replacing of the conducting material in the trenches. Such is described by way of example with reference to FIGS. 33-37 and constructions 10a and 110b. Like numerals from the above-described embodiments have been used where appropriate, with some construction differences being indicated with the suffix "a", the suffice "b", or with different numerals.

Figure 33:
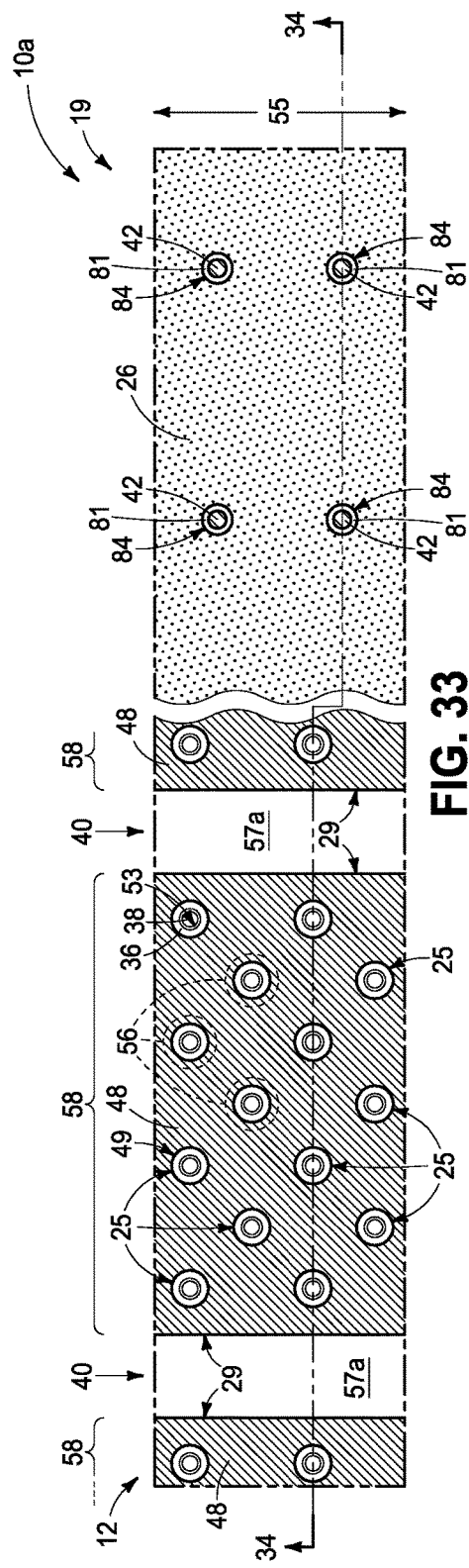
Figure 34:
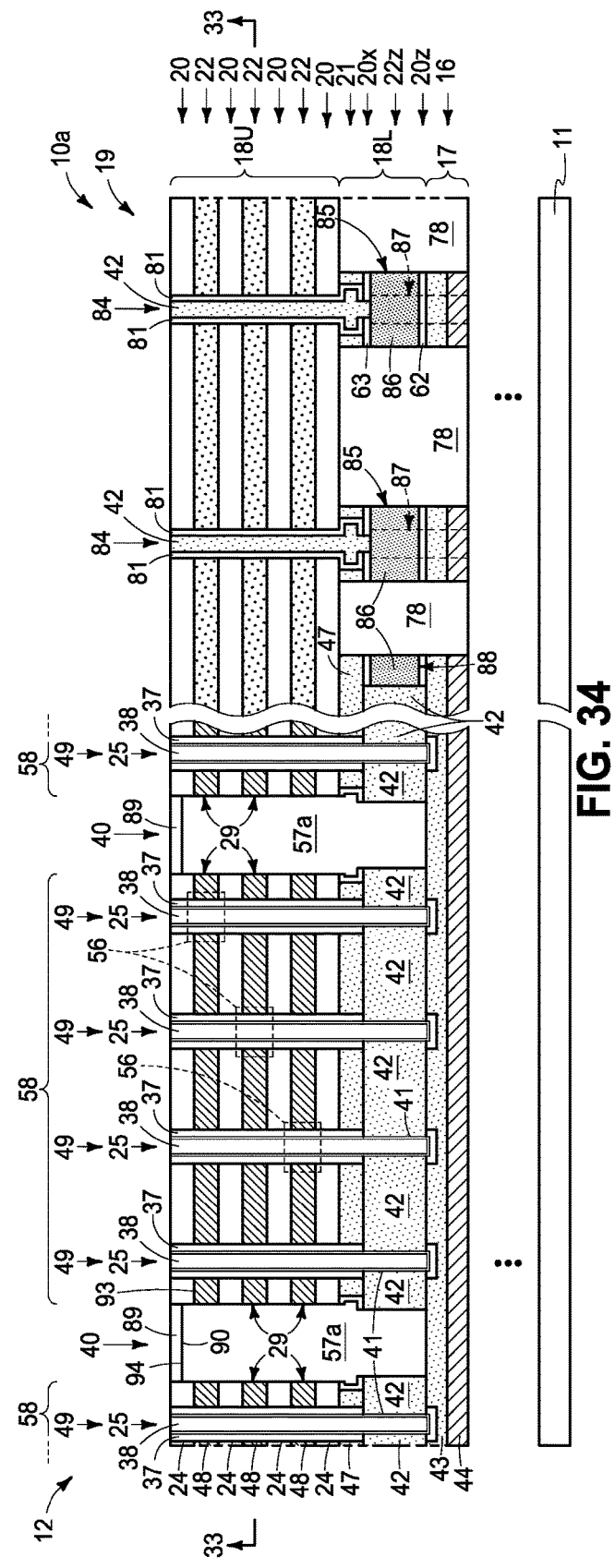
Figure 35:
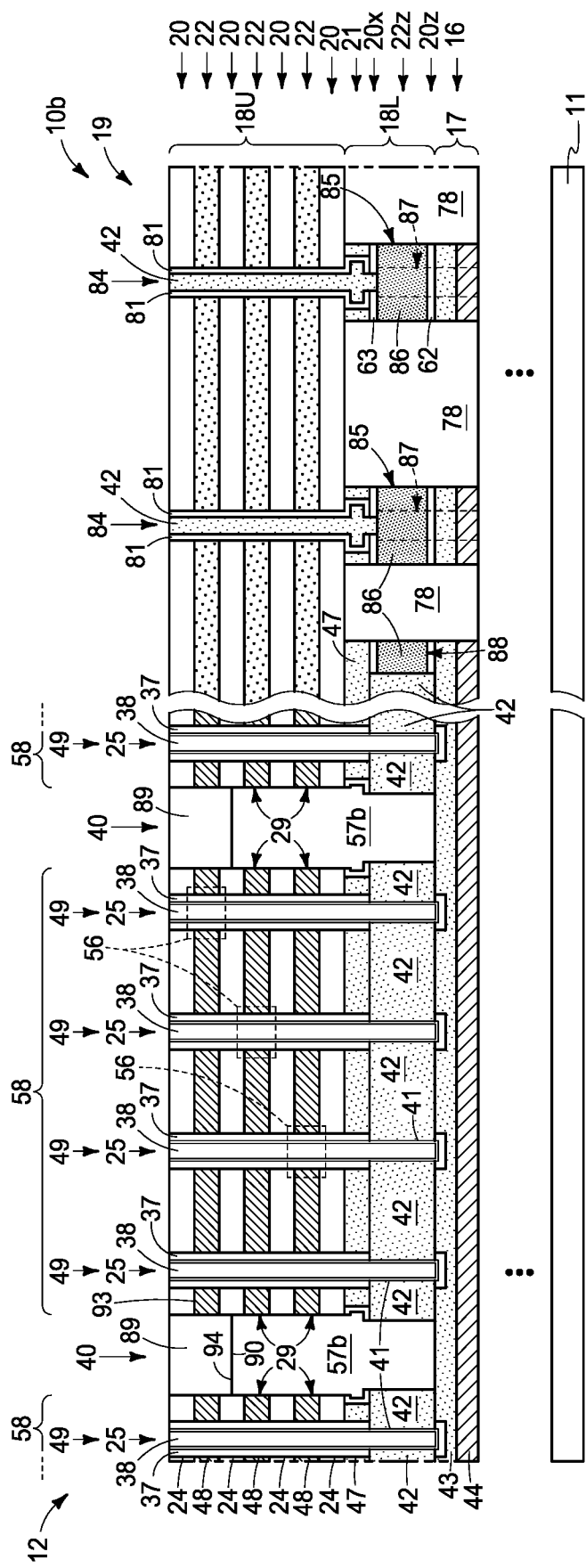
Figure 36:
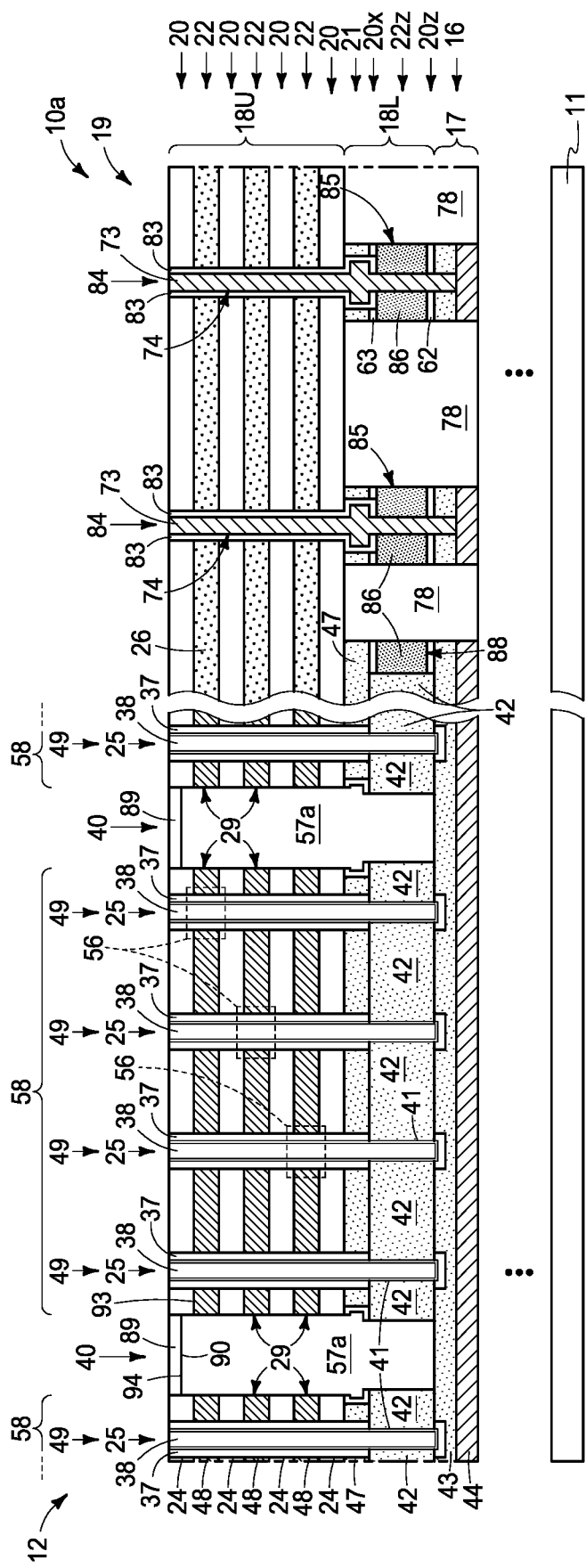
Figure 37:
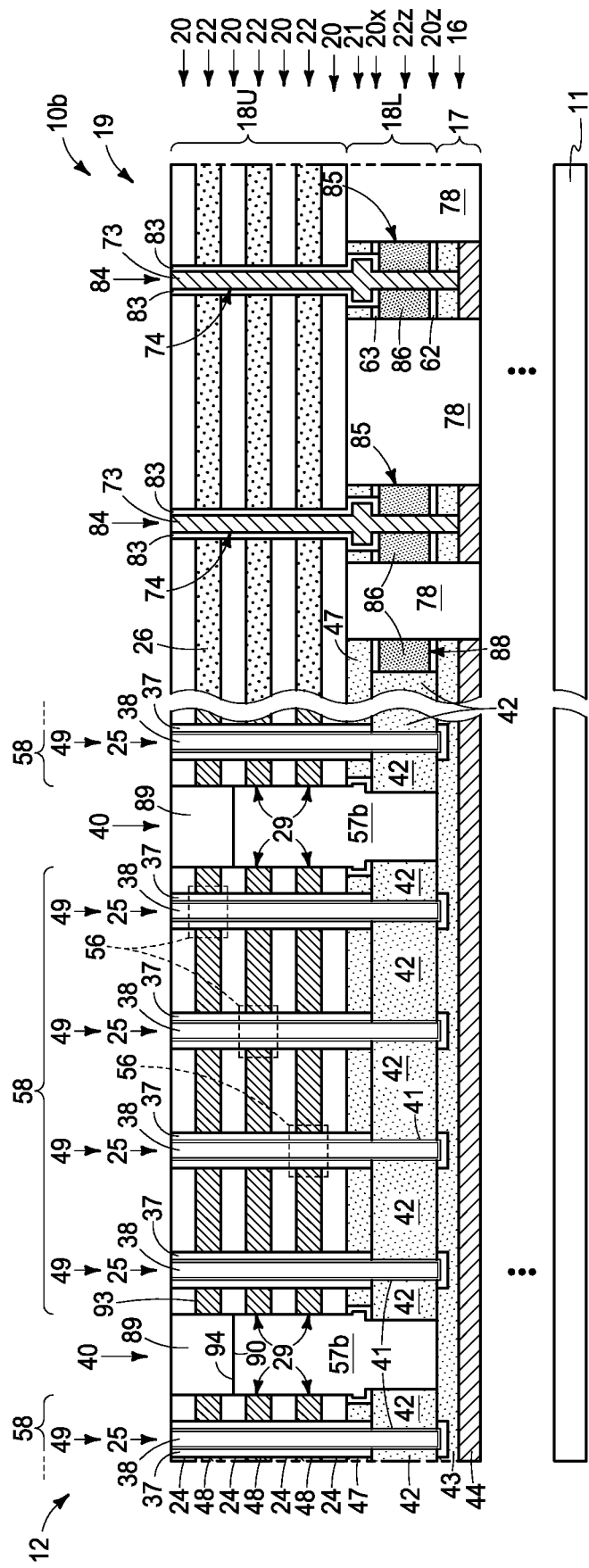

Referring to FIGS. 33 and 34, such is analogous to FIGS. 25 and 26, respectively, but wherein conducting material 24 remains in TAV openings 84. Accordingly, the replacing of conducting material 42 in TAV openings 84 has not yet occurred and the replacing of conducting material 42 in trenches 40 has already occurred. Further, and in one such embodiment, the intervening material comprises an upper material 89 directly above (e.g., directly against) a lower material 57a, with upper material 89 and lower material 57a being of different compositions relative one another. Upper material 89 and lower material 57a, at least in the depicted cross section, are ideally insulative if such are to remain in a finished circuitry construction. Regardless, in method embodiments, ideally upper material 89 is at least etch resistant to an etching chemistry that will later be used to etch materials 42 and 81 (e.g., as ideally is material 24). Example upper materials 89 include silicon dioxide, silicon nitride, silicon oxynitride, HfO$_x$, boron-doped polysilicon, carbon-doped polysilicon, tantalum, and hafnium.

In one embodiment, upper material 89 has a bottom 90 that is above a top 93 of the uppermost first tier 22 and lower material 57a has a top 94 that is above top 93 of the uppermost first tier 22. Alternately, in one embodiment, upper material 89 has its bottom 90 below top 93 of the uppermost first tier 22 and lower material 57b has its top 94 below top 93 of the uppermost first tier 22, for example as shown with respect to a construction 10b in FIG. 35.

Subsequent processing may occur analogous to that described above for construction 10, with FIGS. 36 and 37 showing example finished constructions 10a and 10b analogous to that of FIGS. 25 and 26 for construction 10.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed any where as part of the finished construction, and in some embodiments may be under the array (e.g., CMOS under-array). Regardless, one or more additional such stack(s)/deck(s) may be provided or fabricated above and/or below that shown in the figures or described above Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop". "bottom", "above", "below", "under". "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated region s/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a conductor tier comprising conductor material on a substrate. A stack comprising vertically-alternating first tiers and second tiers is formed above the conductor tier. The stack comprises laterally-spaced memory-block regions and a through-array-via (TAV) region. A lowest of the first tiers comprises sacrificial material. The stack comprises channel-material strings extending through the first tiers and the second tiers. The stack comprises horizontally-elongated trenches extending through the first tiers and the second tiers to the sacrificial material in the lowest first tier and that are individually between immediately-laterally-adjacent of the memory-block regions. The stack comprises TAV openings in the TAV region. An etching fluid is flowed into the TAV openings and into the horizontally-elongated trenches to isotropically etch the sacrificial material. After the isotropic etching and through the horizontally-elongated trenches, conducting material is formed that directly electrically couples together channel material of the channel-material strings and the conductor material of the conductor tier.

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The lower portion comprises laterally-spaced memory-block regions and a through-array-via (TAV) region. The lower portion comprises a lowest of the first tiers that comprises sacrificial material. The vertically-alternating different-composition first tiers and second tiers of an upper portion of the stack are formed above the lower portion. Channel-material strings are formed that extend through the first tiers and the second tiers in the upper portion to the lower portion. Horizontally-elongated trenches are formed through the upper portion and are individually between immediately-laterally-adjacent of the memory-block regions. TAV openings are formed into the upper portion in the TAV region. An etching fluid is flowed into the TAV openings and into the horizontally-elongated trenches to isotropically etch the sacrificial material. After the isotropic etching and through the horizontally-elongated trenches, conducting material is formed that directly electrically couples together channel material of the channel-material strings and the conductor material of the conductor tier.

In some embodiments, a memory array comprising strings of memory cells comprises laterally-spaced memory blocks individually comprising a vertical stack comprising alternating insulative tiers and conductive tiers above a conductor tier. Strings of memory cells comprise channel-material strings that extend through the insulative tiers and the conductive tiers. The channel-material strings directly electrically couple with conductor material of the conductor tier by conducting material that is in a lowest of the conductive tiers and that is directly against multiple of the channel-material strings. A wall is in the lowest conductive tier aside the conducting material. The wall is horizontally-elongated longitudinally-along one of the memory blocks and being in a through-array-via (TAV) region.

In some embodiments, a memory array comprising strings of memory cells comprises laterally-spaced memory blocks individually comprising a vertical stack comprising alternating insulative tiers and conductive tiers above a conductor tier. Strings of memory cells comprise channel-material strings that extend through the insulative tiers and the conductive tiers. The channel-material strings directly electrically couple with conductor material of the conductor tier by conducting material that is in a lowest of the conductive tiers and that is directly against multiple of the channel-material strings. A through-array-via (TAV) region comprises TAVs that individually extend through the lowest conductive tier and into the conductor tier. Individual of the TAVs in the lowest conductive tier comprise a conductive core having an annulus circumferentially there-about. The annulus has dopant therein at a total dopant concentration of 0.01 to 30 atomic percent. Insulative material in the lowest conductive tier is circumferentially about the annulus and between immediately-adjacent of the TAVs.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
   forming a conductor tier comprising conductor material on a substrate;
   forming a stack comprising vertically-alternating first tiers and second tiers above the conductor tier, the stack comprising laterally-spaced memory-block regions and a through-array-via (TAV) region, a lowest of the first tiers comprising sacrificial material, the stack comprising channel-material strings extending through the first tiers and the second tiers, the stack comprising horizontally-elongated trenches extending through the first tiers and the second tiers to the sacrificial material in the lowest first tier and that are individually between immediately-laterally-adjacent of the memory-block regions, the stack comprising TAV openings in the TAV region;
   flowing an etching fluid into the TAV openings and into the horizontally-elongated trenches to isotropically etch the sacrificial material; and
   after the isotropically etching and through the horizontally-elongated trenches, forming conducting material that directly electrically couples together channel material of the channel-material strings and the conductor material of the conductor tier.

2. The method of claim 1 comprising forming a TAV in individual of the TAV openings after forming the conducting material.

3. The method of claim 1 wherein the TAV openings extend to the lowest first tier during the flowing.

4. The method of claim 3 wherein, directly below the TAV openings, the etching fluid does not contact the sacrificial material in the lowest first tier during the flowing.

5. The method of claim 3 wherein, directly below individual of the TAV openings, the stack comprises an island comprising etch-resistant material that is etch resistant to the etching fluid.

6. The method of claim 5 wherein, directly below the TAV openings, the etching fluid contacts the etch-resistant material of the islands during the flowing.

7. The method of claim 6 wherein, directly below the TAV openings, the etching fluid does not contact the sacrificial material in the lowest first tier during the flowing.

8. The method of claim 5 wherein a radially-outermost portion of the island is circumferentially about its TAV opening there-above radially-outward thereof.

9. The method of claim 5 wherein the etch-resistant material comprises dopant therein at a total dopant concentration of 0.01 to 30 atomic percent.

10. The method of claim 5 comprising anisotropically etching through the islands after the flowing to extend the TAV openings deeper into the stack.

11. The method of claim 10 comprising forming a TAV in individual of the TAV openings after the anisotropically etching.

12. The method of claim 5 comprising:
   forming a TAV in individual of the TAV openings;
   forming a sacrificial island in a next-lowest first tier directly above individual of the islands; and
   removing the sacrificial islands before forming the TAVs.

13. The method of claim 1 comprising forming a wall in the lowest first tier, the wall being horizontally-elongated longitudinally-along one of the memory-block regions and being in the TAV region, the wall comprising etch-resistant material that is etch resistant to the etching fluid.

14. The method of claim 13 wherein the etching fluid contacts the etch-resistant material of the wall during the flowing of the etching fluid through one of the horizontally-elongated trenches.

15. The method of claim 13 wherein, directly below individual of the TAV openings, the stack comprises an island of the etch-resistant material.

16. The method of claim 13 comprising:
   forming a TAV in individual of the TAV openings;
   forming a sacrificial rail in a next-lowest first tier directly above individual of the walls; and
   removing the sacrificial rails before forming the TAVs.

17. The method of claim 1 wherein the conducting material is formed to at least predominantly fill remaining volume of the TAV openings and remaining volume of the trenches after the flowing; and further comprising:
   replacing the conducting material in the TAV openings with conductive material to form a TAV in individual of the TAV openings;
   replacing the conducting material in the trenches with intervening material.

18. The method of claim 17 wherein the replacing of the conducting material in the TAV openings occurs before the replacing of the conducting material in the trenches.

19. The method of claim 17 wherein the replacing of the conducting material in the TAV openings occurs after the replacing of the conducting material in the trenches.

20. The method of claim 17 wherein the intervening material comprises an upper material directly above a lower material, the upper and lower materials being of different compositions relative one another.

21. The memory array of claim 20 wherein the upper material has a bottom that is above a top of the uppermost first tier and the lower material has a top that is above the top of the uppermost first tier.

22. The memory array of claim 21 wherein the upper material and the lower material are directly against one another.

23. The memory array of claim 20 wherein the upper material has a bottom that is below a top of the uppermost first tier and the lower material has a top that is below the top of the uppermost first tier.

24. The memory array of claim 23 wherein the upper material and the lower material are directly against one another.

25. A method used in forming a memory array comprising strings of memory cells, comprising:
   forming a conductor tier comprising conductor material on a substrate;
   forming a lower portion of a stack that will comprise vertically-alternating first tiers and second tiers above the conductor tier, the lower portion comprising laterally-spaced memory-block regions and a through-array-via (TAV) region, the lower portion comprising a lowest of the first tiers that comprises sacrificial material;
   forming the vertically-alternating different-composition first tiers and second tiers of an upper portion of the stack above the lower portion, and forming channel-material strings that extend through the first tiers and the second tiers in the upper portion to the lower portion;
   forming horizontally-elongated trenches through the upper portion and that are individually between immediately-laterally-adjacent of the memory-block regions;

forming TAV openings into the upper portion in the TAV region;

flowing an etching fluid into the TAV openings and into the horizontally-elongated trenches to isotropically etch the sacrificial material; and after the isotropically etching and through the horizontally-elongated trenches, forming conducting material that directly electrically couples together channel material of the channel-material strings and the conductor material of the conductor tier.

26. A memory array comprising strings of memory cells, comprising:

laterally-spaced memory blocks individually comprising a vertical stack comprising alternating insulative tiers and conductive tiers above a conductor tier, strings of memory cells comprising channel-material strings that extend through the insulative tiers and the conductive tiers, the channel-material strings directly electrically coupling with conductor material of the conductor tier by conducting material that is in a lowest of the conductive tiers and that is directly against multiple of the channel-material strings; and a wall in the lowest conductive tier aside the conducting material, the wall being horizontally-elongated longitudinally-along one of the memory blocks and being in a through-array-via (TAV) region.

27. The memory array of claim 26 wherein the wall is directly against the conducting material.

28. The memory array of claim 26 wherein the wall and the conducting material comprise a same primary material, the same primary material of the wall being doped with a substance, the same primary material of the conducting material comprising less, if any, of the substance than does the same primary material of the wall.

29. The memory array of claim 28 wherein the primary material is polysilicon and the substance is B, C, O, Ga, or N.

30. The memory array of claim 26 wherein the wall has a top that is at or below a bottom of a next-lowest conductive tier that is directly above the lowest conductive tier.

31. The memory array of claim 26 wherein the wall has a bottom that is at or above a top of the conductor tier.

32. The memory array of claim 26 wherein, the wall has a top that is at or below a bottom of a next-lowest conductive tier that is directly above the lowest conductive tier; and
the wall has a bottom that is at or above a top of the conductor tier.

33. The memory array of claim 26 comprising intervening material between the memory blocks, the intervening material comprising an upper insulating material directly above a lower insulating material, the upper and lower insulating materials being of different compositions relative one another.

34. The memory array of claim 33 wherein the upper insulating material has a bottom that is above a top of the uppermost conductive tier and the lower insulative material has a top that is above the top of the uppermost conductive tier.

35. The memory array of claim 34 wherein the upper insulating material and the lower insulative material are directly against one another.

36. The memory array of claim 33 wherein the upper insulating material has a bottom that is below a top of the uppermost conductive tier and the lower insulative material has a top that is below the top of the uppermost conductive tier.

37. The memory array of claim 36 wherein the upper insulating material and the lower insulative material are directly against one another.

38. A memory array comprising strings of memory cells, comprising:

laterally-spaced memory blocks individually comprising a vertical stack comprising alternating insulative tiers and conductive tiers above a conductor tier, strings of memory cells comprising channel-material strings that extend through the insulative tiers and the conductive tiers, the channel-material strings directly electrically coupling with conductor material of the conductor tier by conducting material that is in a lowest of the conductive tiers and that is directly against multiple of the channel-material strings;

a through-array-via (TAV) region comprising TAVs that individually extend through the lowest conductive tier and into the conductor tier, individual of the TAVs in the lowest conductive tier comprising a conductive core having an annulus circumferentially there-about, the annulus having dopant therein at a total dopant concentration of 0.01 to 30 atomic percent; and insulative material in the lowest conductive tier circumferentially about the annulus and between immediately-adjacent of the TAVs.

39. The memory array of claim 38 wherein the total dopant concentration is 1.0 to 30.0 atomic percent.

40. The memory array of claim 39 wherein the total dopant concentration is 1.0 to 10.0 atomic percent.

41. The memory array of claim 38 wherein the annulus has straight radially-outer sides.

42. The memory array of claim 38 wherein the annulus and the conducting material comprise a same primary material, the same primary material of the conducting material comprising less, if any, of the dopant than does the same primary material of the annulus.

43. The memory array of claim 42 wherein the primary material is polysilicon and the dopant is B, C, O, Ga, or N.

44. The memory array of claim 38 wherein individual of the TAVs in a next-lowest conductive tier that is directly above the lowest conductive tier comprise the conductive core having another annulus circumferentially there-about.

45. The memory array of claim 44 wherein the another annulus is of different composition from that of the annulus in the lowest conductive tier.

46. The memory array of claim 44 wherein the another annulus is radially smaller than the annulus in the lowest conductive tier.

47. The memory array of claim 44 wherein the another annulus and the annulus in the lowest conductive tier are directly against one another.

48. The memory array of claim 47 wherein the another annulus is of different composition from that of the annulus in the lowest conductive tier.

49. The memory array of claim 48 wherein the another annulus is radially smaller than the annulus in the lowest conductive tier.

50. The memory array of claim 38 wherein the another annulus has straight radially-outer sides.

51. The memory array of claim 50 wherein the annulus that is in the lowest conductive tier has straight radially-outer sides.

52. The memory array of claim 38 wherein the annulus has a top that is at or below a bottom of a next-lowest conductive tier that is directly above the lowest conductive tier.

53. The memory array of claim 38 wherein the annulus has a bottom that is at or above a top of the conductor tier.

54. The memory array of claim 38 wherein, the annulus has a top that is at or below a bottom of a next-lowest conductive tier that is directly above the lowest conductive tier; and the annulus has a bottom that is at or above a top of the conductor tier.

55. The memory array of claim 38 comprising a wall in the lowest conductive tier aside the conducting material, the wall being horizontally-elongated longitudinally-along one of the memory blocks and being in the TAV region.

56. The memory array of claim 55 wherein the wall has the dopant therein at the total dopant concentration of 0.01 to 30 atomic percent.

57. The memory array of claim 38 comprising intervening material between the memory blocks, the intervening material comprising an upper insulating material directly above a lower insulating material, the upper and lower insulating materials being of different compositions relative one another.

58. The memory array of claim 57 wherein the upper insulating material has a bottom that is above a top of the uppermost conductive tier and the lower insulative material has a top that is above the top of the uppermost conductive tier.

59. The memory array of claim 58 wherein the upper insulating material and the lower insulative materials are directly against one another.

60. The memory array of claim 57 wherein the upper insulating material has a bottom that is below a top of the uppermost conductive tier and the lower insulative material has a top that is below the top of the uppermost conductive tier.

61. The memory array of claim 60 wherein the upper insulating material and the lower insulative materials are directly against one another.

* * * * *